US007821790B2

(12) United States Patent
Sharma et al.

(10) Patent No.: US 7,821,790 B2
(45) Date of Patent: Oct. 26, 2010

(54) MODULAR CHASSIS PROVIDING SCALABLE MECHANICAL, ELECTRICAL AND ENVIRONMENTAL FUNCTIONALITY FOR MICROTCA AND ADVANCED TCA BOARDS

(75) Inventors: Viswa N. Sharma, San Ramon, CA (US); William Chu, Elmsford, NY (US); Allen D. James, Cottage Grove, MN (US); Ming Siu Tseng, Fremont, CA (US); Neil Schlegel, Deer Park, WI (US); David Lentz, Hopkins, MN (US); Christopher D. Sonnek, North Saint Paul, MN (US)

(73) Assignee: SLT Logic, LLC, Boston, MA (US)

( * ) Notice: Subject to any disclaimer, the term of this patent is extended or adjusted under 35 U.S.C. 154(b) by 223 days.

(21) Appl. No.: 11/728,718

(22) Filed: Mar. 26, 2007

(65) Prior Publication Data

US 2008/0037218 A1 Feb. 14, 2008

Related U.S. Application Data

(60) Provisional application No. 60/743,761, filed on Mar. 24, 2006.

(51) Int. Cl.
 H05K 7/16 (2006.01)
 H05K 5/00 (2006.01)
 H05K 7/00 (2006.01)
(52) U.S. Cl. .................. 361/727; 361/725; 361/731
(58) Field of Classification Search ......... 361/724–732, 361/736, 737, 679.48–679.49, 690–695
 See application file for complete search history.

(56) References Cited

U.S. PATENT DOCUMENTS

| 3,868,158 | A | * | 2/1975 | Laboue ................. 312/350 |
| 3,874,444 | A | * | 4/1975 | Perce et al. ............. 165/47 |
| 4,126,269 | A | * | 11/1978 | Bruges ................. 236/49.3 |
| 4,187,058 | A | | 2/1980 | Fish |
| 4,453,785 | A | * | 6/1984 | Smith ................. 312/9.48 |
| 5,031,070 | A | * | 7/1991 | Hsu ................... 361/679.6 |
| 5,136,464 | A | * | 8/1992 | Ohmori ................ 361/694 |
| 5,268,637 | A | | 12/1993 | Liken et al. |
| 5,409,419 | A | * | 4/1995 | Euchner et al. ........ 454/184 |
| 5,412,534 | A | * | 5/1995 | Cutts et al. ........... 361/695 |
| 5,528,454 | A | * | 6/1996 | Niklos ................. 361/695 |
| 5,557,506 | A | * | 9/1996 | Wood et al. ............ 361/796 |

(Continued)

OTHER PUBLICATIONS

*Micro Telecommunications Computing Architecture Short Form Specification, PICMG® MTCA.0 R1.0*, pp. 1-34, copyright 2006.

(Continued)

*Primary Examiner*—Jayprakash N Gandhi
*Assistant Examiner*—Adrian S Wilson
(74) *Attorney, Agent, or Firm*—Patterson Thuente Christensen Pedersen, P.A.

(57) ABSTRACT

A modular chassis arrangement for electronic modules that is configurable into a mechanically and electrically interconnected structure capable of delivering scalable mechanical, electrical and environmental functionality for a multiplicity of electronic modules. In one embodiment, the electronic modules are compliant with AdvancedTCA or MicroTCA standards in a modular Pico-Shelf configuration that support stackable and/or back-to-back multiple unit chassis.

19 Claims, 20 Drawing Sheets

U.S. PATENT DOCUMENTS

| | | | |
|---|---|---|---|
| 5,680,294 A * | 10/1997 | Stora et al. | 361/695 |
| 5,751,549 A * | 5/1998 | Eberhardt et al. | 361/679.33 |
| 5,949,646 A * | 9/1999 | Lee et al. | 361/695 |
| 5,982,634 A | 11/1999 | Wronski | |
| 6,166,917 A * | 12/2000 | Anderson | 361/756 |
| 6,181,570 B1 | 1/2001 | Ellebrecht et al. | |
| 6,253,266 B1 | 6/2001 | Ohanian | |
| 6,320,760 B1 | 11/2001 | Flamm et al. | |
| 6,370,605 B1 | 4/2002 | Chong, Jr. | |
| 6,456,498 B1 * | 9/2002 | Larson et al. | 361/752 |
| 6,466,449 B1 * | 10/2002 | Sheen et al. | 361/752 |
| 6,496,376 B1 * | 12/2002 | Plunkett et al. | 361/729 |
| 6,504,717 B1 * | 1/2003 | Heard | 361/695 |
| 6,522,539 B2 * | 2/2003 | Ota et al. | 361/695 |
| 6,661,673 B2 | 12/2003 | Brooks et al. | |
| 7,159,062 B2 | 1/2004 | Byers et al. | |
| 6,693,901 B1 | 2/2004 | Byers et al. | |
| 6,694,392 B1 * | 2/2004 | Haren | 710/65 |
| 6,704,196 B1 * | 3/2004 | Rodriguez et al. | 361/679.33 |
| 6,708,372 B2 | 3/2004 | Stewart | |
| 6,795,314 B1 | 9/2004 | Arbogast et al. | |
| 6,805,560 B1 | 10/2004 | Budny et al. | |
| 6,900,387 B2 * | 5/2005 | Gravell et al. | 174/50 |
| 6,934,786 B2 | 8/2005 | Irving et al. | |
| 6,935,868 B1 | 8/2005 | Campini et al. | |
| 6,944,020 B2 * | 9/2005 | Wintersteen et al. | 361/679.49 |
| 6,968,958 B2 | 11/2005 | Lauchner et al. | |
| 6,985,967 B1 | 1/2006 | Hipp | |
| 7,013,352 B2 | 3/2006 | Garnett | |
| 7,083,422 B2 | 8/2006 | Campini et al. | |
| 7,099,160 B1 * | 8/2006 | Ice | 361/802 |
| 7,101,188 B1 | 9/2006 | Summers et al. | |
| 7,120,739 B2 | 10/2006 | Fujimoto et al. | |
| 7,172,432 B2 * | 2/2007 | Campini et al. | 439/74 |
| 7,200,003 B2 * | 4/2007 | Hood et al. | 361/679.33 |
| 7,239,509 B1 * | 7/2007 | Roeske | 361/679.02 |
| 7,259,961 B2 * | 8/2007 | Lucero et al. | 361/695 |
| 7,293,090 B1 | 11/2007 | Saleh et al. | |
| 7,324,348 B2 * | 1/2008 | Berg et al. | 361/752 |
| 7,370,223 B2 | 5/2008 | Olmstead et al. | |
| 7,388,757 B2 * | 6/2008 | Moakes et al. | 361/788 |
| 7,509,375 B2 | 3/2009 | Christian et al. | |
| 7,516,263 B2 * | 4/2009 | Sandy et al. | 710/316 |
| 7,603,580 B2 | 10/2009 | Zohar et al. | |
| 2003/0130969 A1 | 7/2003 | Hawkins et al. | |
| 2003/0152074 A1 | 8/2003 | Hawkins et al. | |
| 2003/0182483 A1 | 9/2003 | Hawkins | |
| 2004/0073834 A1 | 4/2004 | Kermaani et al. | |
| 2004/0264145 A1 * | 12/2004 | Miller et al. | 361/725 |
| 2005/0141207 A1 | 6/2005 | Campini | |
| 2005/0280986 A1 * | 12/2005 | Coglitore et al. | 361/687 |
| 2005/0281014 A1 | 12/2005 | Carullo et al. | |
| 2006/0002098 A1 | 1/2006 | Berg, Jr. et al. | |
| 2006/0023384 A1 | 2/2006 | Mukherjee et al. | |
| 2006/0036793 A1 | 2/2006 | Sandy et al. | |
| 2006/0044756 A1 | 3/2006 | Wong | |
| 2006/0114923 A1 | 6/2006 | Overgaard | |
| 2006/0221559 A1 | 10/2006 | Campini et al. | |
| 2006/0221581 A1 | 10/2006 | DeNies et al. | |
| 2007/0038732 A1 | 2/2007 | Chandwani et al. | |
| 2007/0121306 A1 | 5/2007 | Moakes et al. | |
| 2007/0217172 A1 | 9/2007 | Bisbikis et al. | |
| 2007/0255430 A1 | 11/2007 | Sharma et al. | |
| 2008/0062667 A1 | 3/2008 | Campini et al. | |
| 2009/0097200 A1 | 4/2009 | Sharma et al. | |

OTHER PUBLICATIONS

*Advanced Telecommunications Computing Architecture Short Form Specification PICMG, 3.0®*, pp. 1-33, copyright 2003.

*Advanced MC Short Form Specification, PICMG® AMC.0 R2.0*, pp. 1-56. copyright 2006.

Application and File History of U.S. Appl. No. 11/626,334, filed Jan. 23, 2007, Inventors Sharma et al.

Application and File History of U.S. Appl. No. 12/101,739, filed Apr. 11, 2008, Inventors Sharma et al.

PCT Patent Application No. PCT/US2008/004741; filed Apr. 11, 2008; Applicant SLT Logic LLC; Written Opinion dated Nov. 12, 2008.

PCT Patent Application No. PCT/US2008/004741; filed Apr. 11, 2008; Applicant SLT Logic LLC; Search Report dated Nov. 12, 2008.

PCT Patent Application No. PCT/US2007/07490; filed Mar. 26, 2007; Applicant SLT Logic LLC; Written Opinion dated Mar. 21, 2008.

PCT Patent Application No. PCT/US2007/07490; filed Mar. 26, 2007; Applicant SLT Logic LLC; Search Report dated Mar. 21, 2008.

* cited by examiner

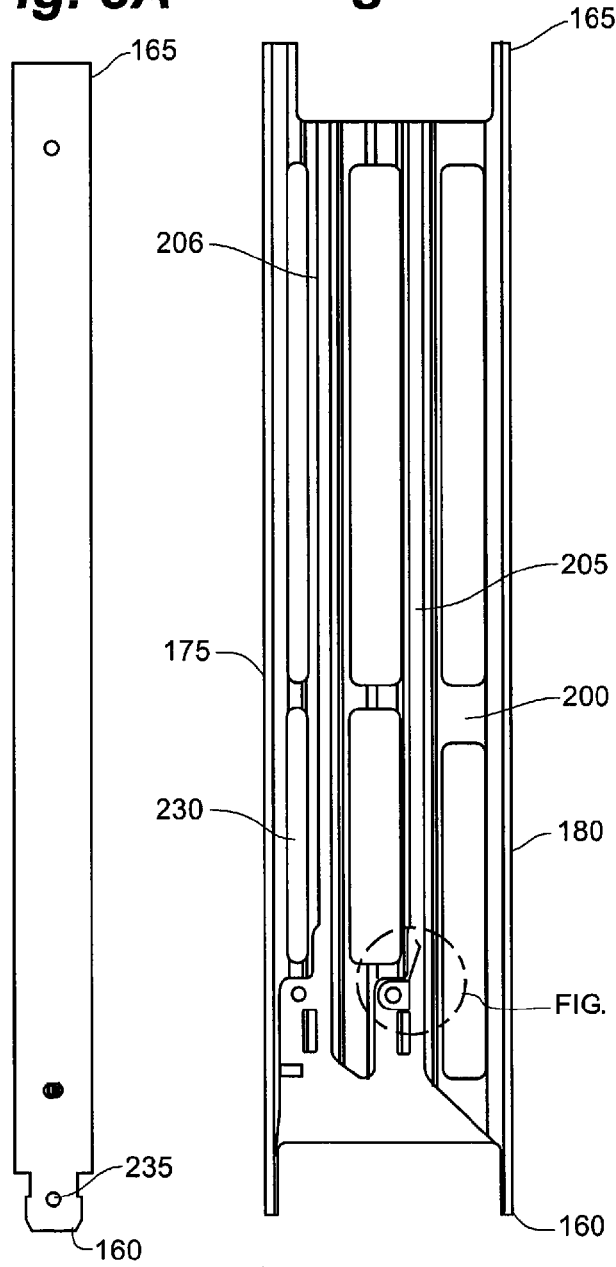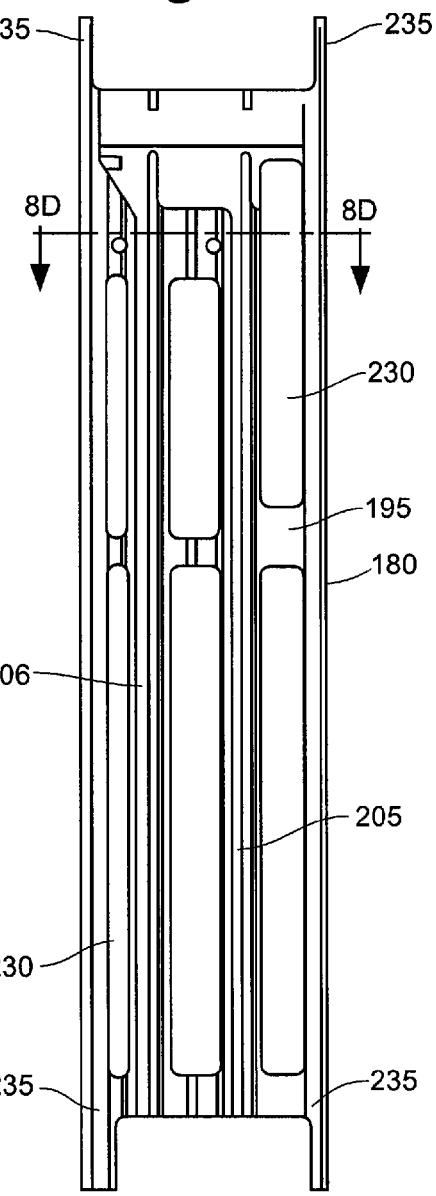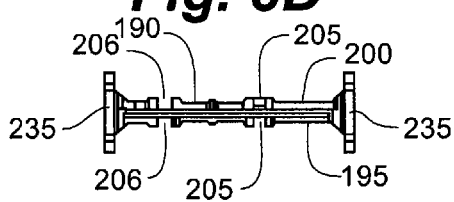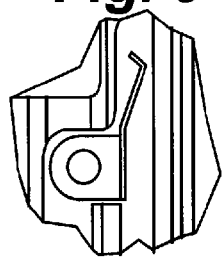

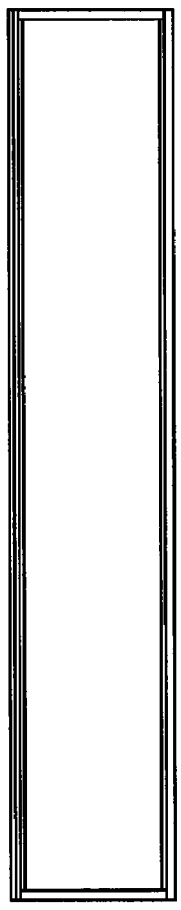
Fig. 11A
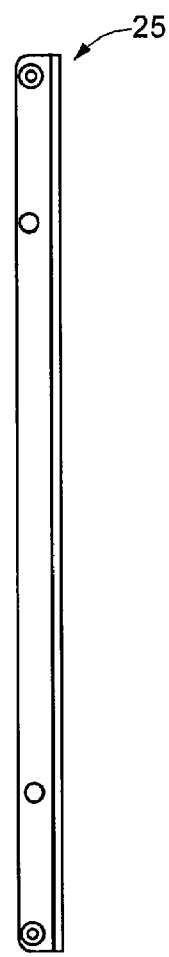
Fig. 11B
Fig. 11C
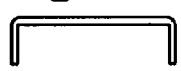
Fig. 11D
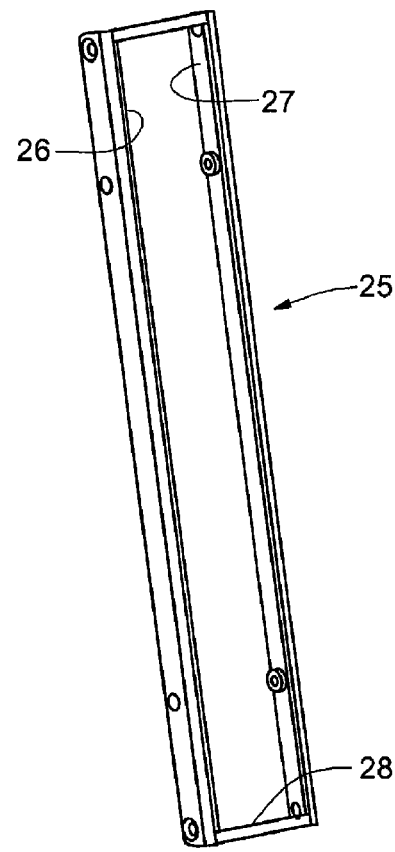
Fig. 12
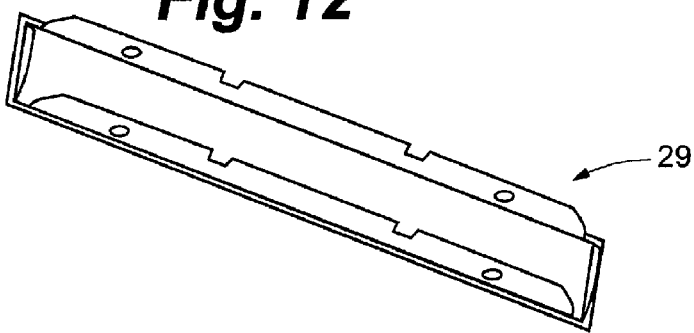

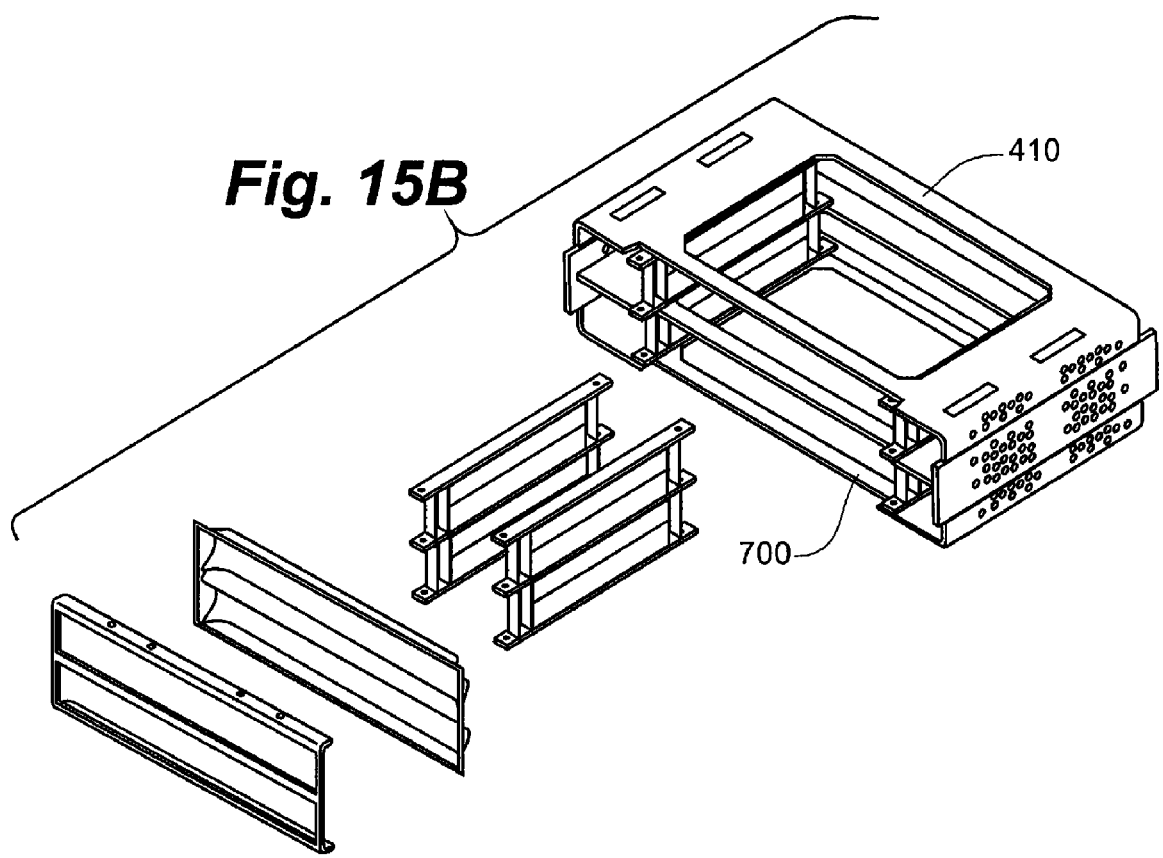

Fig. 17
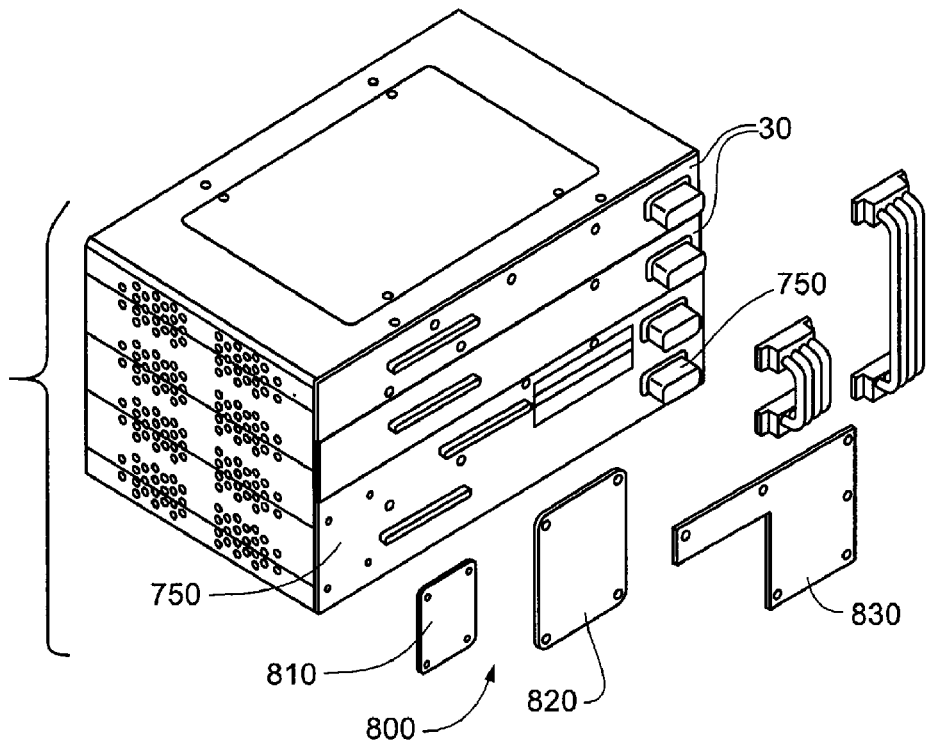
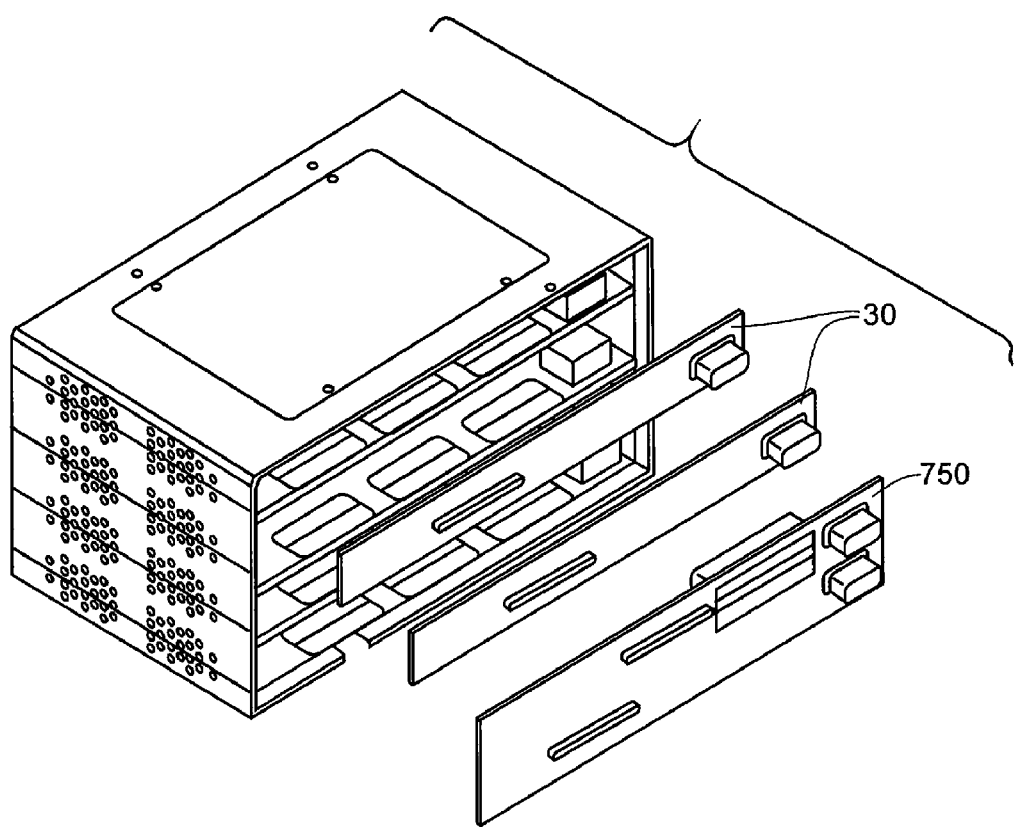

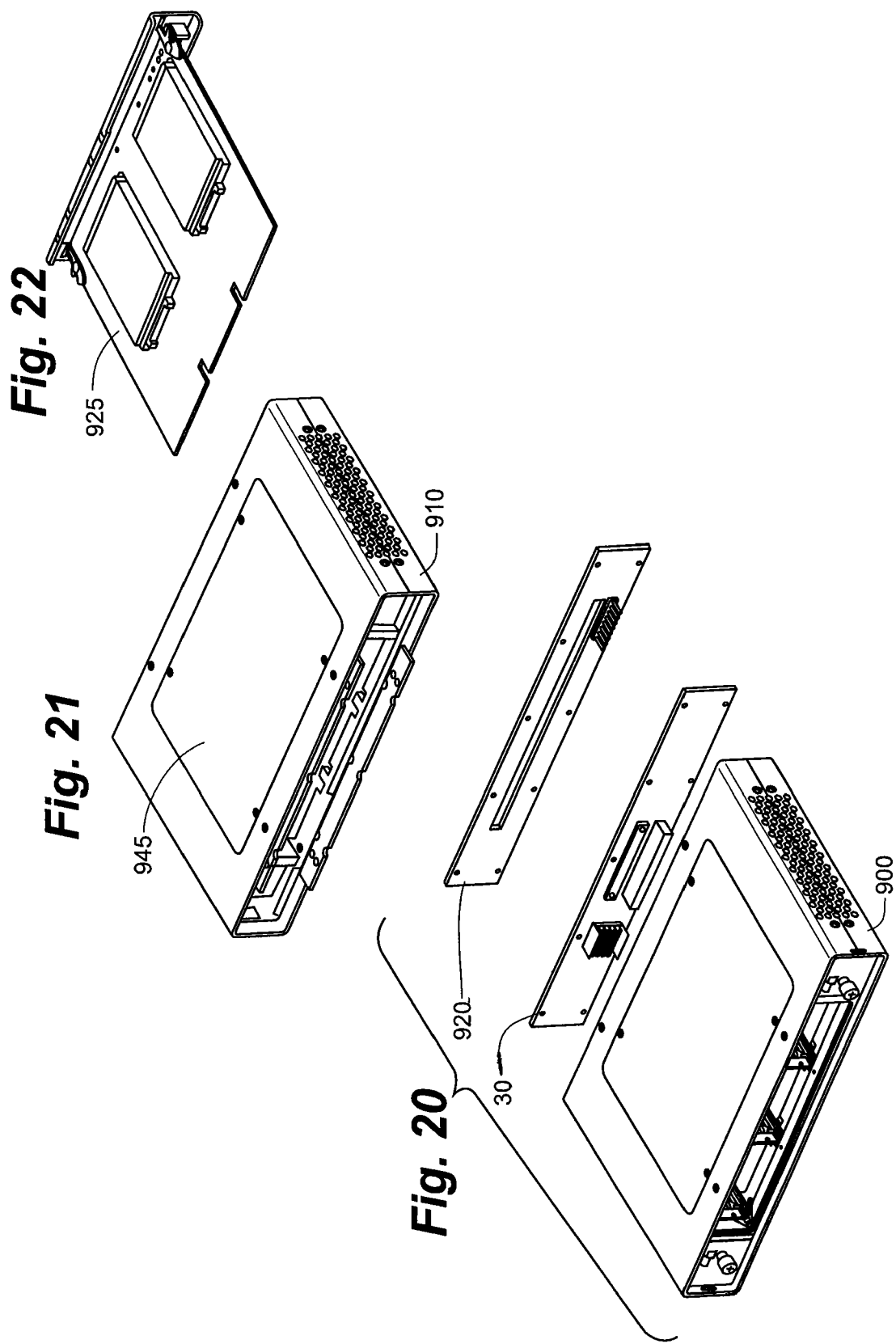

MODULAR CHASSIS PROVIDING SCALABLE MECHANICAL, ELECTRICAL AND ENVIRONMENTAL FUNCTIONALITY FOR MICROTCA AND ADVANCED TCA BOARDS

PRIORITY CLAIM

The present invention claims priority to U.S. Provisional Patent Application Ser. No. 60/743,761, entitled "Modular Chassis Providing Scalable Mechanical, Electrical and Environmental Functionality for MicroTCA Carrier Boards," filed Mar. 24, 2006, the entire disclosure of which is hereby incorporated by reference.

FIELD OF THE INVENTION

The present invention relates generally to telecommunications, networking and computer equipment and specifically, but not exclusively, to a modular chassis arrangement that is configurable into an interconnected structure providing scalable mechanical, electrical and environmental functionality for housing a multiplicity of AMC carrier boards, particularly Micro Telecom Computing Architecture (MicroTCA) and Advanced Telecom Computing Architecture (ATCA) carrier boards.

BACKGROUND OF THE INVENTION

There has been a widespread shift from the historic telecommunications business model which fostered low unit volume, relatively high price proprietary system architectures to standards-based solutions built using commercial off-the-shelf (COTS) technology. One of the business drivers for this shift is the need for flexibility to respond to a rapidly changing network infrastructure and the need to keep operating and capital expenditures low. Catalyzing this shift are standards based technologies that adhere to specifications defined by industry sponsored standards making bodies. For example, the Advanced Telecom Computing Architecture (or AdvancedTCA™ hereinafter "ATCA") based platform can be used by both, suppliers and end-users to construct ATCA standard-compliant solutions.

The ATCA specification is a series of industry standards that define scalable, standardized platform architecture to extend COTS to a broad spectrum of products from component vendors. ATCA compliant components and systems embody interoperable ATCA technology such as physical format, system management and software designed to deliver cost effective, reduced time-to-market, off-the-shelf solutions that can be incorporated into products ranging from high-availability, carrier-grade telecom, storage, and computing applications. ATCA is sponsored by the PCI (Personal Computer Interconnect)—Industrial Computer Manufacturers Group (PICMG®), a major industry standards body.

The ATCA Base Specification, PIGMG 3.0 Revision 1.0, ratified in Dec. 30, 2002 (hereinafter "the ATCA specification"), defines an open electromechanical architecture of a modular platform that may be constructed from commercial off-the-shelf components. The electromechanical architecture encompasses the rack and shelf (chassis) mechanical form factors, power parameters, cooling characteristics, core backplane fabric interconnects and system management architecture to enable the construction of a modular platform that is capable of receiving a multiplicity of ATCA compliant modular plug-in circuit boards (ATCA carrier cards). The ATCA compliant modular plug-in circuit boards feature an open electromechanical architecture also defined by the ATCA specification. The ATCA base specification together with other associated specifications define multiple fabric connections and support multiple protocols for control and data plane communications including Ethernet, Fibre Channel, InfiniBand, StarFabric, PCI Express, and RapidIO®.

The PICMG® Advanced Mezzanine Card (AMC) base specification, PIGMG AMC.0, Revision 1.0, published Jan. 3, 2005 (hereinafter referred to as the AMC.0 specification, the entire contents of which are incorporated herein by reference) adds versatility to the modularity provided by the ATCA specification. The AMC specification defines the base-level mechanical, management, power, thermal, interconnect (including I/O) and system management requirements for hot-swappable, field-replaceable, add-on mezzanine cards (or modules) which may be hosted by an ATCA or a proprietary carrier board. Each AMC Module is received into an AMC Connector, seated parallel to the host carrier card and configured for high-speed, packet-based serial communications between the AMC card and the carrier board.

There are six different form factors defined in the AMC specification which include two AMC module widths (W): the single width module (73.5 mm) and a double width module (148.5 mm); three heights (H) or thicknesses: compact (13.8 mm), mid-sized (18.96 mm) and full-sized (28.95 mm); and a single depth (D) (181.5 mm). The height (H) is measured in a direction normal to the major plane of the AMC card. The width (W) and height (H) dimensions lie along mutually perpendicular directions in a plane that is normal to the direction along which the depth (D) is measured. When the AMC module is mounted vertically, the width dimension is aligned vertically and the height or thickness dimension is aligned horizontally. The reverse is the case when the AMC module is mounted horizontally. Additionally, the AMC specification refers to three types of carrier board configurations—conventional, cutaway and hybrid.

The availability of AMC cards having a wide variety of form factors allows the cards to accommodate a rich mix of circuit elements and circuit topologies to support many different application architectures that can address the needs of diverse segments of the computer and telecommunications marketplace. The AMC architecture supports a number of transfer protocols with varying band widths as described in the subsidiary PICMG standard AMC3.0 for example. AMC cards extend the functionality of the ATCA carrier boards and permit multiple vendors to build technology solutions for transmission and switching equipment and allow these technology solutions to be used in multiple applications and in multiple vendor product lines. The ATCA standardization approach in general improves product reliability (allowing for industry standard hot swappable hardware and software, including power supplies and fans) and drives down prices-due in large part to greater economies of scale in manufacturing and less time spent on details standardized by ATCA (e.g., power, cooling, mechanical spacing and connectors issues).

Technology implementations based on the ATCA specification represent "big iron" solutions that are suited to telephone company central offices with high density needs: i.e., switching systems and transmission cross connects. These chasses are too massive for remote/enterprise applications. Likewise, ATCA blades feature a form factor that makes them unsuitable for edge applications such as cellular base stations, wire-line fiber pedestals, workgroup routers, modular servers, SAN storage boxes, network hubs (Wi-Fi/Wi-MAX), military, aeronautical, and medical applications. In response, the members of PICMG have recently ratified the MicroTCA specification (MicroTCA.0 R1.0, Jul. 6, 2006) (hereinafter "the MicroTCA specification") which represents a culmination of effort that resulted in several earlier draft specifications such as, for instance, PICMG® MicroTCA.0 Draft 0.32, Apr. 15, 2005 et seq. The following discussion presents certain details regarding the structural and operational aspects of MicroTCA-standards based systems that are described in the publicly available short form specification derived from the PICMG® MTCA.0 Micro Telecommunications Computing Architecture (MicroTCA.0) specification. (MicroTCA and the µTCA are trademarks of PICMG. AdvancedTCA and AdvancedMC are registered trademarks of PICMG).

The MicroTCA specification utilizes the PICMG AMC form-factor and management infrastructure for mezzanine blades as set forth in the ATCA specification to define the standardized elements needed to implement a MicroTCA Shelf (or "Shelf" which is also known as the chassis), including power modules, cooling elements, connectors, interconnects, backplane, MicroTCA Carrier Hub (MCH) and the subrack. The Shelf may be configured to realize diverse small foot-print, low-cost, flexible, and scalable platforms comprised entirely of AMC modules and interoperable components and systems. The thrust of MicroTCA is the reuse of technology defined by the AMC standard so that an AMC card (or module) can be used with either an ATCA carrier board or a "MicroTCA Carrier".

The "MicroTCA Carrier" as the term is used in MicroTCA, refers to the elements of a MicroTCA Shelf defined in AMC.0 including, among others, cooling and power delivery elements, a backplane with clock, fabric, power and management interconnects, and centralized hardware management that collectively emulate the requirements of the ATCA carrier board and can nominally support up to 12 AMC modules. Each AMC module plugs directly into the MicroTCA backplane instead of an ATCA based carrier board. A MicroTCA system consists of at least one AMC card. Additionally, a MicroTCA system also consists of at least one MicroTCA-specific module not defined by the AMC.0 specification. For example, a MicroTCA system consists of at least one AMC card and at least one MicroTCA-specific AMC-sized card called a MicroTCA Carrier Hub (MCH). The MCH combines the control and management infrastructure and the interconnect fabric resources needed to support up to 12 AMC modules. The MCH also contains IPMI software for managing key chassis functions, as well as clocking AMC daughter cards for different applications. Another MicroTCA-specific component is the power module, which fits in the same form factor as an AMC card. Thus configured, the MicroTCA form factor targets communications equipment ranging from pole mounted devices to core routers and IP-gateways, radio base stations and switching centers.

The outer dimensions of a MicroTCA system are defined by the Shelf which is rack-mountable (or frame-mountable). The Shelf is the basic autonomous unit of a MicroTCA system. The rack-mountable Shelf may be divided by rack-mounted Cubes, free-standing Cubes or Pico subassemblies (alternatively enclosures) to be populated with AdvancedMC modules. A MicroTCA specification compliant Shelf is either the 19 in. Shelf as defined in IEC 60297 or the Metric Shelf as defined in IEC 60917. Height dimensions of Shelves are generally designed using increments of 1 U/SU to follow common equipment practice where 1 U=44.45 mm or 1.75 in.

By definition, the Shelf contains at least a portion of a MicroTCA "Subrack." A Subrack is a mechanical assembly that provides the structural support for Shelf elements such as the AMCs, the MicroTCA Carrier elements and the backplane. A Shelf element may be a board typically comprising of components mounted on a printed circuit, an electromechanical assembly such as a fan module or a mechanical component such as a filter. The Subrack serves to receive, locate and enclose the electronic components in relative alignment to each other within the Shelf or chassis. The Subrack is also equipped with the mounting holes, card guides, cable guides, mounting brackets, EMC/ESD control structures, handle interface, face plate mounting hardware, air-flow guiding means and associated features. The standard orientation of the Subrack is vertical. When oriented in the horizontal direction, the vertical dimensions are followed. In the vertical direction, Subracks are divided into subsections of Tiers. The minimum requirement is one Tier; the maximum may be 4 Tiers. In the horizontal direction, Subracks are divided into subsections of slots where a slot is defined as a union of a connector and a card guide and defines the position of one AMC, MCH, or Power Module (PM). A MicroTCA Subrack can contain multiple Slots. Full-Height Modules, Mid-Size Modules and Half-Height Modules may be mixed and arranged in any order, horizontally across the MicroTCA Subrack.

A MicroTCA shelf can be configured to accommodate a large number of AMCs combined in multiple Tiers to achieve a high system density. The basic MicroTCA shelf equipped with 12 AMC modules can provide an overall chassis capability of (12.5 Gbps/per AMC.0 card×12 AMC.0 cards) 150 Gbps. The physical dimensions of the standard Shelf make it too large for certain applications such as, for instance, game boxes, personal computers, single board computers, SATA/SAS storage modules, and WiMAX modules that are designed for operation on mobile platforms. Furthermore, many applications may not need the capacity that the full complement of 12 AMC.0 cards can provide. To accommodate such situations, the MicroTCA standard provides for special MicroTCA Shelves such as the MicroTCA Cube Shelf and MicroTCA Pico Shelf that can be configured for space-constrained applications while providing the desired level of functionality by leveraging the compact size of the AMCs. Each of these mechanical infrastructures can accommodate different complements of AMCs depending upon the size of the AMC, MCH capacity, enclosure width, and enclosure height. Certain architectures, such as the Pico Shelf architecture, are not required to contain a standalone MCH or PM. Instead, connections can be made directly between the various AMC modules using the backplane or between the AMC modules and elements on the backplane.

The MicroTCA specification leaves many design details of the Subrack undefined. The Subrack essentially defines only the AMC.0, MCH, and Power Module interfaces and the dimensions which govern the interface of AdvancedMC Modules to the Subrack and Backplane. All other Shelf architecture (including, the Cube Shelf and the Pico Shelf) dimensions remain undefined. Likewise, Subrack materials and design details are left undefined. Similarly, a MicroTCA shelf design (including the Pico Shelf) may have to comply with thermal, acoustic, shock and vibration related functional specifications imposed by the MicroTCA standard. The specification does not, however, provide a reference mechanical design capable of meeting these requirements. It is thus possible to design a large number of systems that conform to the specification. For example, the MicroTCA standard supports six form-factors for the AMC cards. The largest form factor is the Full-Height, Double-Width (Double Full-Size) AMC which occupies a mechanical volume of 150 (W)× 187.3 (D)×30.48 mm (H). However, this volume can be subdivided into some number of smaller AMCs that fit into an enclosure with a smaller foot-print.

It is also possible to design systems that conform to the specification but include non-compliant components and subsystems where the specification is silent thereby considerably extending the range of technology solutions covered by the scope of the specification. The MicroTCA specification prescribes that the MCH, PM, CU and AMCs be Field Replaceable Units (FRUs). As noted in the MicroTCA specification, a particularly challenging aspect of the mechanical design is an option to permit in-field re-configuration of numerous and various types of AMCs, used in multiple positions in a MicroTCA Shelf. (See, section 1.2.4.5 of the MicroTCA Specification).

It would be advantageous to provide a modular, scalable electronic enclosure that conforms to the MicroTCA specification, accommodates non-compliant architecture where not prohibited by the MicroTCA specification, permits in-filed re-configuration of the AMC modules in multiple positions in the MicroTCA Shelf, facilitates in-field reconfiguration of the shelf geometry without the need to relax the geometrical tolerances required by the MicroTCA specification and is sufficiently versatile to accommodate the requirements of an evolving specification.

SUMMARY OF THE INVENTION

In accordance with various embodiments of the present invention, an apparatus and system are provided to serve as a modular chassis arrangement for electronic modules that is configurable into a mechanically and electrically interconnected structure capable of delivering scalable mechanical, electrical and environmental functionality for a multiplicity of electronic modules. More specifically, the present invention serves as an enclosure or chassis for a complete standalone MicroTCA system comprising at least one AdvancedTCA and optionally one or more MicroTCA-specific modules configured into a fully compliant AMC and MicroTCA solution.

For purposes of the present invention, the term module (or board) refers to any MicroTCA module type, a non-MicroTCA unit, or even a printed circuit board on which electronic components and wiring are located. Examples of a module include the Cooling Unit (CU), Power Module (PM), MicroTCA Controller Hub (MCH), OEM Module, or AMC carrier board. In a related embodiment, at least one of the modules located within the enclosure is non-MicroTCA compliant.

In accordance with one embodiment of the present invention, a chassis serving as an enclosure for a standalone MicroTCA system is selectively configurable into a slot for use with non-MicroTCA and non-AMC modules of arbitrary width. The non-standard modules may be used either in conjunction with or independent of AdvancedTCA and MicroTCA specific modules.

In accordance with another embodiment of the present invention, a unit chassis having at least one standardized dimension and a backplane are provided where the unit chassis comprises a mechanically and electrically interconnected structure having the smallest form factor compliant with the MicroTCA standard but still capable of delivering scalable mechanical, electrical and environmental functionality to support at least one AdvancedTCA module. In this embodiment, the backplane can provide point-to-point traces between each AdvancedTCA module/card (or other electronic card) and the MCH, and between the AdvancedTCA module/card (or other electronic card) themselves.

In one embodiment, a unit chassis of a first form factor is adjustably reconfigurable to provide a slot density that can accept the maximum number of electronic modules each of which can be of a different second form factor. In a related embodiment, a first unit chassis and a second unit chassis of the same form factor as the first unit chassis are coupled back-to-back with a shared mid-plane that serves as the backplane of each of the first and second unit chasses. The midplane may include printed circuitry operable to provide data communications between a plurality of modules housed within the first unit chassis and at least one module housed within the second unit chassis.

One embodiment of the present invention includes at least one removable access panel provided on the unit chassis. The removable access panel provides access to the enclosure that is formed by at least a portion of the unit chassis and to the components on the various AMC and other cards supported within the enclosure while maintaining structural integrity of the unit chassis. According to some embodiments, removal of the access panel enables in-situ operations such as inspection, probing and testing of selected components housed within the enclosure of the unit chassis without interfering with the operation of the MicroTCA system or the structural integrity of the unit chassis. In one embodiment, the access panel is adapted to cover less than a surface area of a major side of the unit chassis and be removed from the unit chassis such that a skeletal framework of the unit chassis is unaffected by removal of the access panel. In a related embodiment, the access panel includes a pair of panels, each adapted to cover one of a corresponding top and bottom major surface of the unit chassis. This embodiment enables more robust access to the entire array of modules and circuitry from more than a single direction for purposes of debugging and testing while the system is in operation.

Another embodiment of the present invention provides a scalable, stacked enclosure wherein at least two unit chasses, each of which is associated with at least one common standardized dimension, are configured to form a plurality of tiers stacked with their common standardized dimensions disposed in parallel alignment relative to each other in the vertical plane. Each tier has opposite front and rear faces with respect to the horizontal dimension, and optionally, each front face is oriented in the same direction with respect to the scalable enclosure. Each unit chassis comprising a tier can support at least one of an AdvancedTCA, MicroTCA-Specific or non-Standard printed circuit board card assemblies. In one embodiment, the stacked enclosure is equipped with a solitary MCH housed in a base unit chassis that provides the specified IPMI management, networking, and clock infrastructure to the staked enclosure. The modular nature of each such unit chassis allows for incremental addition, elimination or swapping out of one or more of the unit chassis comprising the MicroTCA system without disrupting the operation of other unit chasses in the system.

In one embodiment of the present invention, the scalable, stacked enclosure is equipped with at least one passive interconnect circuit board that provides communication lanes for transferring communications to and from a first backplane associated with a unit chassis that houses the MCH module and a second backplane associated with one or more the remaining unit chasses. In a related aspect of this embodiment, there is provided at least one active interconnect that replaces the passive interconnect and serves to condition the communication signal transferred between the first and second backplanes against signal degradation occurring during transmission along a signal path. In a further related aspect of this embodiment, both a passive and an active interconnection can be provided among multiple chassis in a stackable or back-to-back arrangement of unit chasses in the system. In a related aspect of this embodiment either of a passive or active interconnection are provided by modular backplane extensions that include connectors on one or more edges of the modular backplane extensions such that multiple extensions may be connected together in a generally planar arrangement to form the backplane for a scalable, stacked arrangement of chasses.

In one embodiment of the present invention, the scalable, stacked enclosure advantageously provides a single, monolithic backplane that is coplanar with and substitutes for the backplanes of each of the constituent modular unit chasses of the stack. According to another aspect of the present invention, the monolithic backplane allows the use of a single, planar, power management and distribution printed circuit board (PCB) and a single, planar signal interconnect PCB to provide an integrated power and signal management system for the entire stack of unit chasses.

According to still another embodiment of the present invention, the modular system is directed to an expandable, stackable MicroTCA specification based modularized enclosures for holding modular telecom and non-telecom devices in a vertical tower configuration. In one aspect of this embodiment, there are provided three different structural units each of which represents a basic Pico-Shelf compliant with the MicroTCA specification. One of the basic units is configured to be used as a base unit. A second basic unit is configured to be used as a cap unit or apical unit. One or more third units are configured to be sandwiched between the apical and base units or disposed above or below another intermediate unit. The stacking of the units enables the backplanes of each of the constituent modular units of the stack to be coplanar to allow the use of a single, planar power management and distribution printed circuit board (PCB) and a single, planar signal interconnect PCB for providing an integrated power and signal management system spanning the entire stack.

One aspect of the present invention advantageously provides component slots to house a plurality of cooling units for generating a standards-prescribed volumetric air-flow within the enclosure alone a standards-prescribed direction. In one embodiment, the cooling units are identical in form and function and are designed as field replacement units to provide a cost-effective cooling solution. The cooling units may be arranged in a push-pull configuration with a first cooling unit proximate an inlet vent operative to pull air into the enclosure and a second paired cooling unit proximate an exhaust vent operative to push the air out of the enclosure so as to deliver the standards-defined cooling performance in a compact, cost-effective package that maximizes the volume of the enclosure available for housing modules. In a related embodiment, an enclosure having a open design wherein the structural elements interior to the enclosure are equipped with apertures and vents sized and located is provided to allow the volumetric air flow generated by the cooling units to flow relatively unimpeded along the standards-prescribed direction. In yet another embodiment, filler modules that have the same form factor as an AMC card are bereft of any circuitry are provided. When a slot in a unit chassis or a stacked enclosure is unpopulated, a filler module is inserted into the slot to prevent the air-flow from taking the path of least resistance and exiting prematurely from the enclosure instead of flowing along the standards-prescribed direction within the enclosure. In another embodiment, the leveraging of unused cooling capacity by providing a filler module that is configured to obstruct air flow through the standards-prescribed pathway within a tier and divert the air flow along an alternate pathway into an adjacent tier enables an increase in the total volumetric flow rate above the as-designed point over a selected portion of the stacked enclosure. In another embodiment, a replaceable filter is positioned adjacent a cooling unit located proximate an inlet side. The cooling unit draws in air from the ambient through vents provided on the inlet side of the enclosure.

In one embodiment, a static charge dissipater for each module slot in the enclosure. The static charge dissipater is in the form of an Electro Static Discharge (ESD) clip positioned on a card guide (i.e., board guide) and connected to shelf ground by a conductive path extending along a structural element forming the enclosure. The ESD clip contacts the printed circuit board (PCB) edge as the AMC module is inserted into the enclosure and provides a path for ESD energy on the PCB to be discharged into the shelf.

Other features and advantages of the invention will become apparent to one skilled in the art upon review of the following detailed description, claims and drawings in which like numerals are used to designate like features.

BRIEF DESCRIPTION OF THE DRAWINGS

The invention may be more completely understood in consideration of the following detailed description of various embodiments of the invention in connection with the accompanying drawings, in which:

FIGS. 8A, 8B, 8C, and 8D are the top view, the right side view, the left side view and the front view respectively of an exemplary strut of the present invention.

FIG. 9 is a locally enlarged view of an exemplary ESD clip according to one exemplary embodiment of the present invention.

FIGS. 11A, 11B and 11C and 11D are the front view, the top view and the side view respectively of an exemplary face-plate according to an embodiment of the present invention.

FIG. 12 is a perspective view of an electrostatic discharge (ESD) backer according to an exemplary embodiment of the present invention.

FIGS. 15A-15D depict an exemplary process of assembling the stacked modular unit of FIG. 14.

FIGS. 17 and 18 illustrate backplane topologies for stacked modular units according to the present invention.

FIGS. 19-22 illustrate a rear transition module configuration according to one exemplary embodiment of the present invention.

Figure 1:
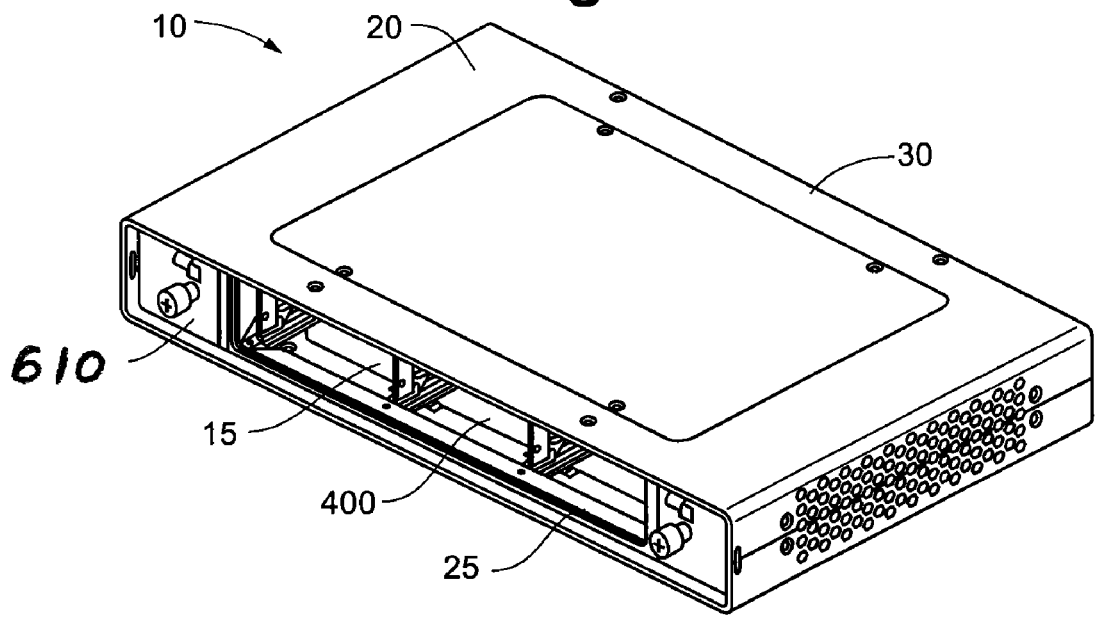
FIG. 1 is a perspective view of an exemplary modular chassis of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

Before the embodiments of the invention are explained in detail, it is to be understood that the invention is not limited in its application to the details of construction and the arrangements of the components set forth in the following description or illustrated in the drawings. The invention is capable of other embodiments and of being practiced or being carried out in various ways. Also, it is understood that the phraseology and terminology used herein are for the purpose of description and should not be regarded as limiting. The use herein of "including" and "comprising" and variations thereof is meant to encompass the items listed thereafter and equivalents thereof, as well as additional items and equivalents thereof. Furthermore, the term "connected" is used herein to denote a direct physical and/or mechanical connection between elements. The terms "coupled," "operably coupled," or "operably connected," as used herein signify an indirect connection between elements.

Figure 2:
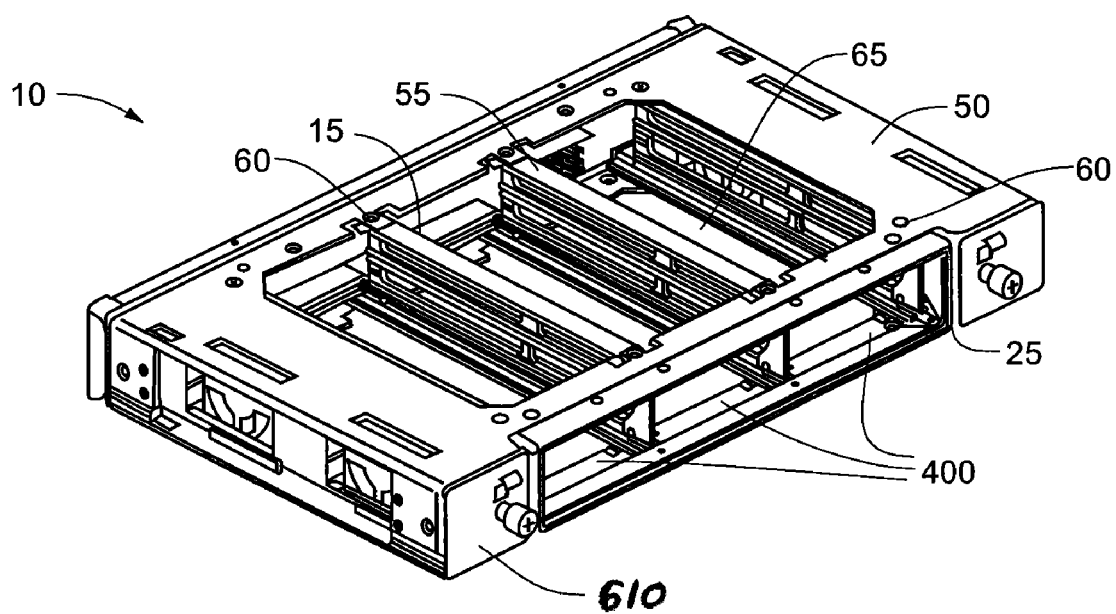
FIG. 2 is the exemplary modular chassis of FIG. 1 with the covers removed.
Figure 3:
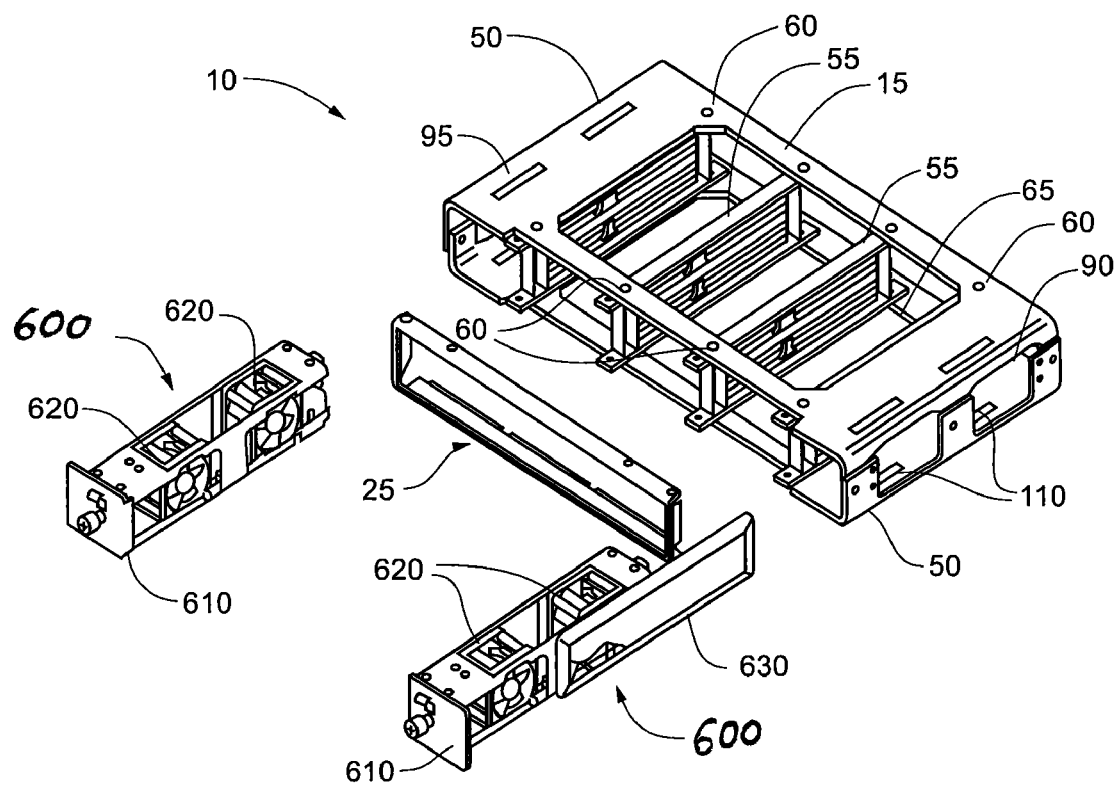
FIG. 3 is a partial exploded view of the illustration of FIG. 2 depicting the skeleton frame, the face plate, and a first electromechanical assembly according to an exemplary embodiment of the present invention.
Figure 4:
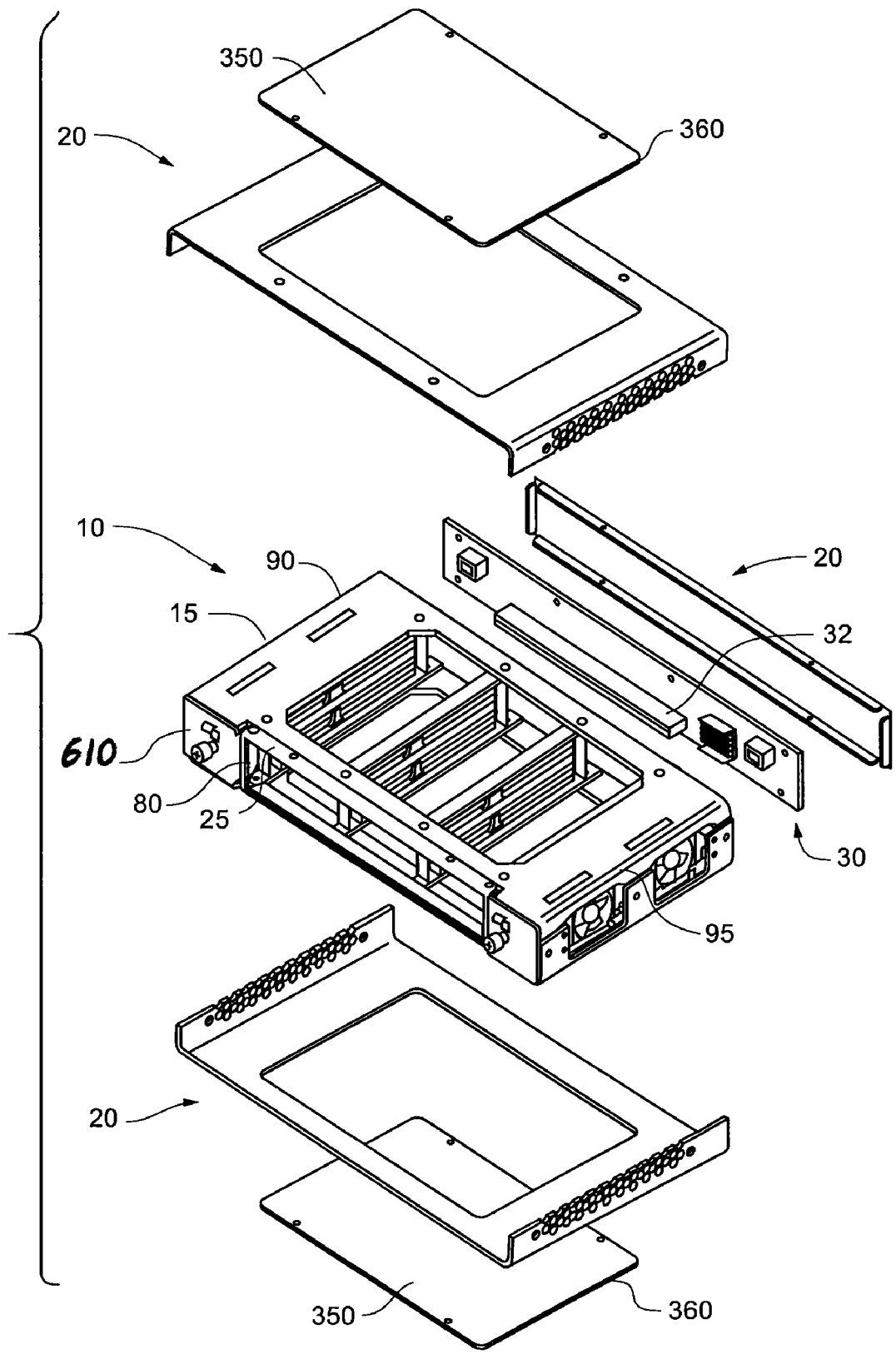
FIG. 4 is alternate partial exploded view of the illustration of FIG. 1 illustrating the skeleton frame, the covers, the face plate and a second electromechanical assembly according to the exemplary embodiment illustrated in FIG. 3.
Figure 5A:
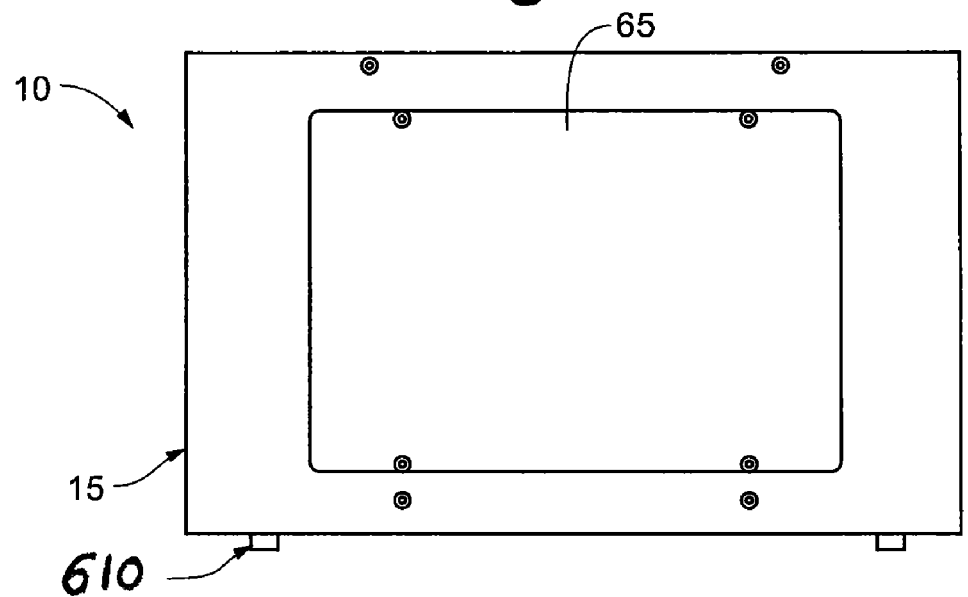
FIG. 5 depicts the front, side and top views of an embodiment of the present invention.
Figure 5B:
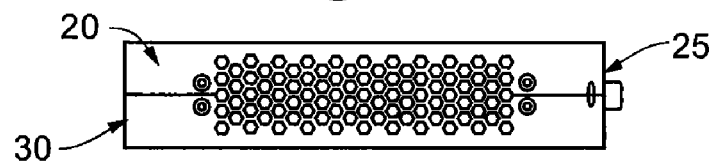
Figure 5C:
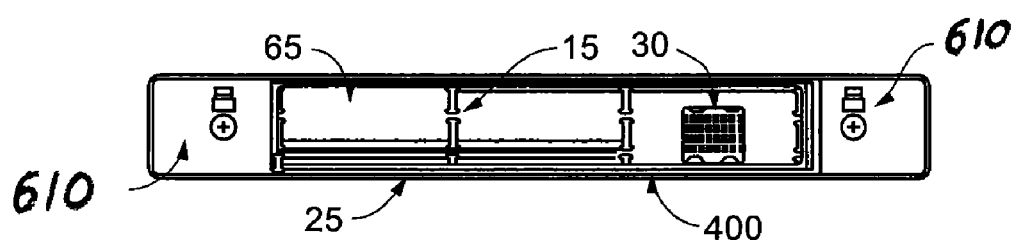

FIGS. 1 and 2 are perspective views of a of modular chassis 10 providing scalable mechanical, electrical and environmental functionality for AMC, MicroTCA-specific and non-MicroTCA boards according to one embodiment of the invention. FIGS. 3 and 4 are partial exploded views of the invention illustrated in FIGS. 1 and 2 and FIG. 5 is a diagrammatic representation of the front, top and side views of the invention illustrated in FIGS. 1-4. The chassis 10 (alternatively "enclosure," "box," "pico-box") generally includes a skeleton frame 15, covers 20, a face plate 25 and electromechanical assembly 30 mounted onto the chassis, which collectively provide the scalable mechanical, electrical and environmental functionality for AMC boards according to the present invention. In one embodiment, the chassis 10 is configured to receive at least one AdvancedTCA board, one or more MicroTCA specific modules such as a Power Module (PM), a MicroTCA Carrier Hub (MCH), one or more Cooling Units (CU) (i.e., a first example of a electromechanical assembly 30 of the present invention) and optionally non-MicroTCA specific modules all of which may be operably connected to a backplane (i.e., a second example of an electromechanical assembly 30 of the present invention) as will be described in the following sections.

Figure 6:
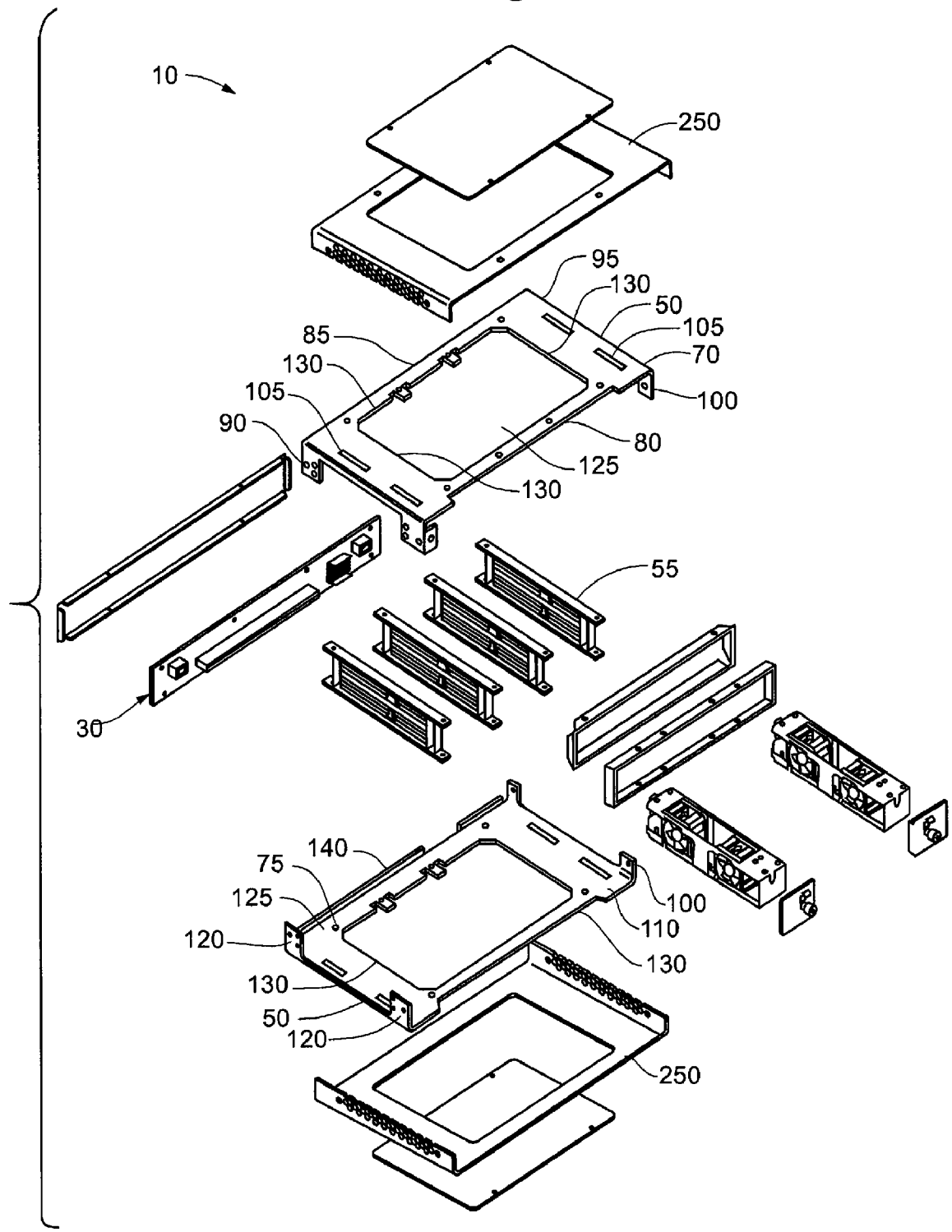
FIG. 6 is an exploded view of the modular chassis of an exemplary embodiment according to the present invention.
Figure 7A:
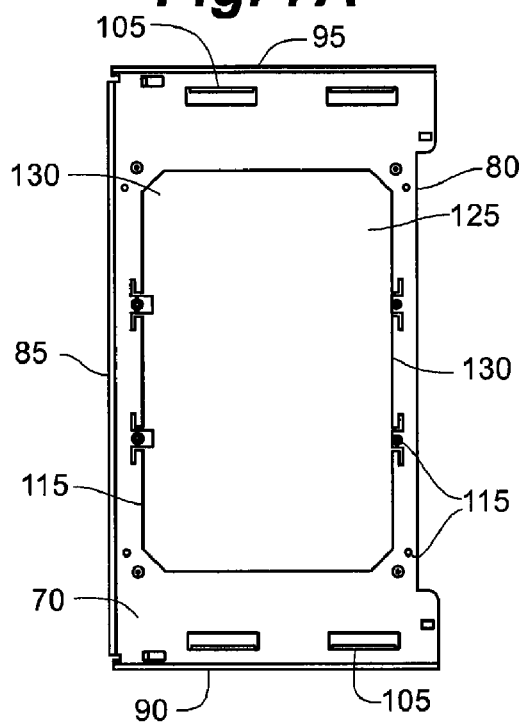
FIGS. 7A, 7B, 7C, 7D and 7E are the top view, right side view, left side view, front view and rear view respectively of an exemplary inner cover of the skeleton frame according to the exemplary embodiment of the present invention.
Figure 7B:
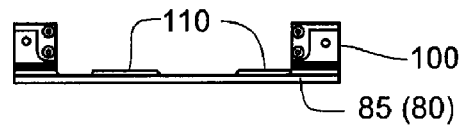
Figure 7C:
Figure 7D:
Figure 7E:
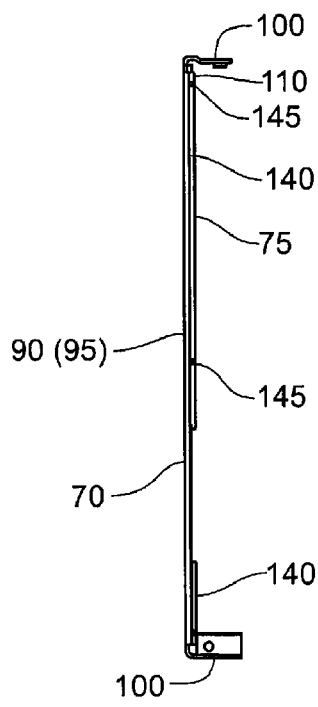
Figure 7F:
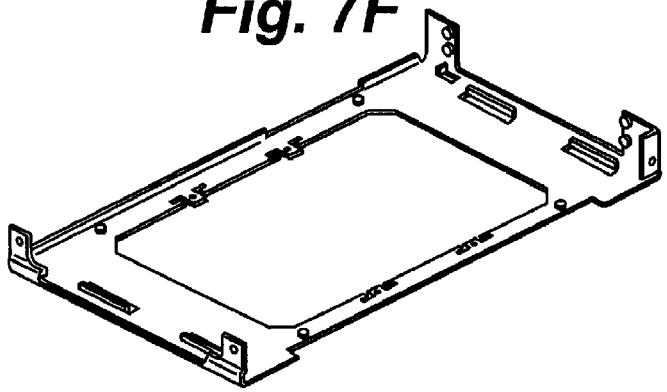
FIG. 7F is an isometric view of an exemplary inner cover according to one embodiment of the present invention.
Figure 10A:
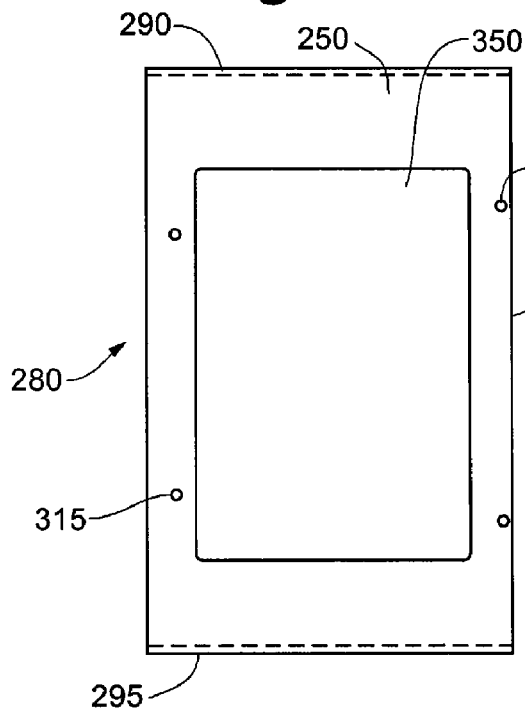
FIGS. 10A, 10B, 10C, and 10D are the top view, front view, side view and perspective view respectively of an exemplary outer cover of the chassis according to an embodiment of the present invention.
Figure 10B:
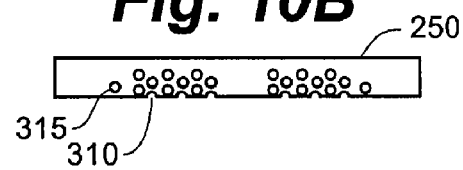
Figure 10C:
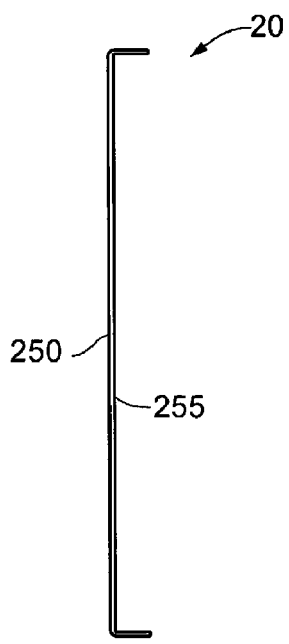
Figure 10D:
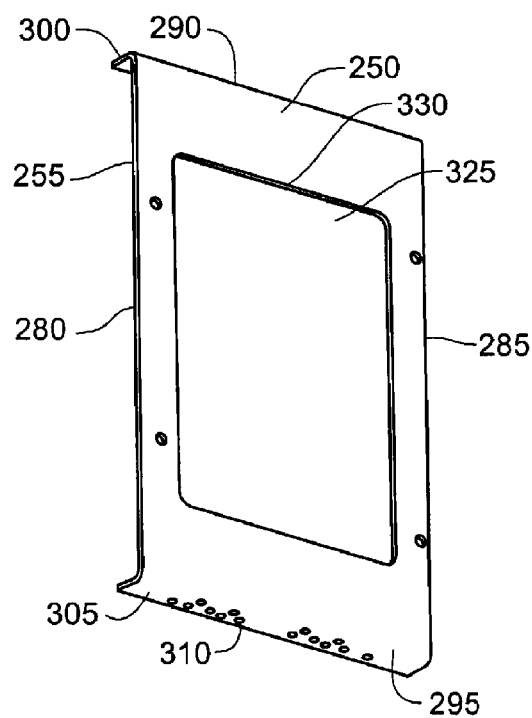
Figure 13A:
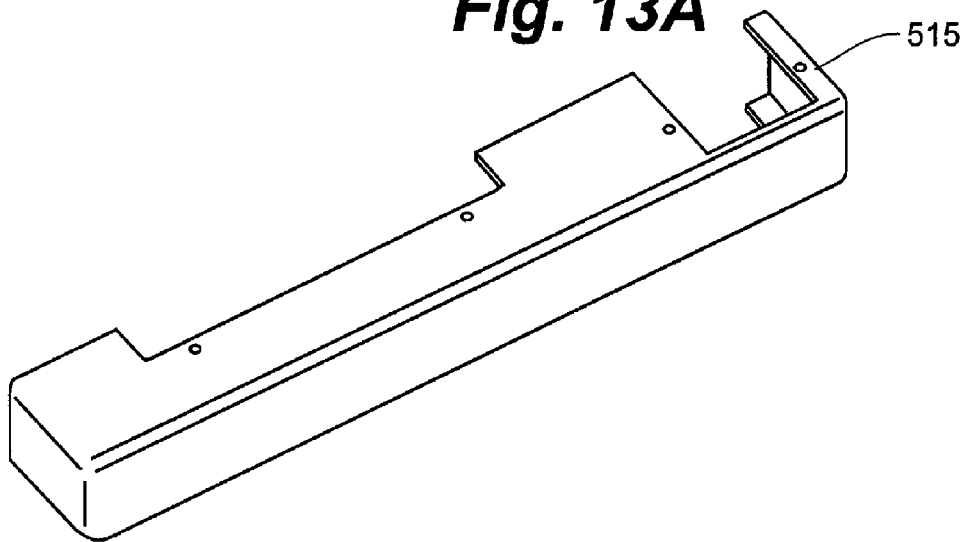
FIGS. 13A, 13B, 13C, and 13D are respectively a perspective view of a rear cover, a first removable rear cover panel, a second removable rear cover panel for a single tier chassis and a rear cover for a two tier (2 U) chassis respectively according to an exemplary embodiment of the present invention.
Figure 13C:
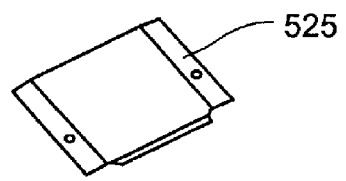
Figure 13B:
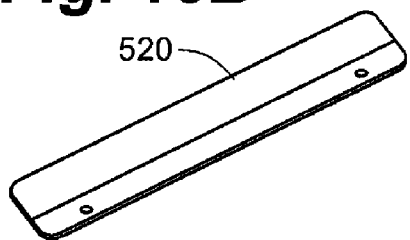
Figure 13D:
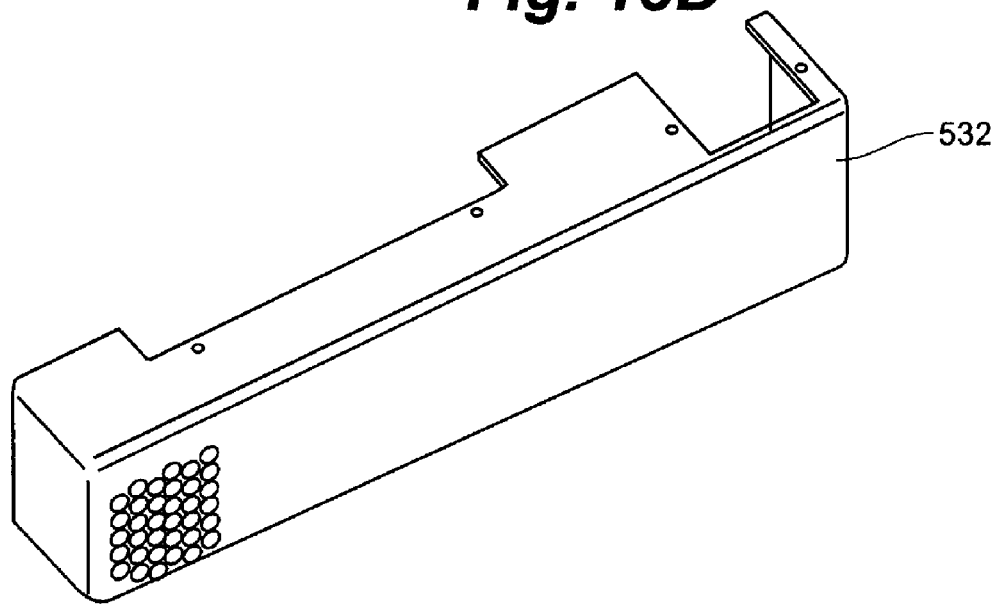

The skeleton frame 15 will be described in more detail in with reference to FIGS. 3, 6, 7, and 8. FIG. 6 depicts an exploded view of some of the major components of one embodiment of chassis 10 according to the present invention. FIGS. 7A, 7B, 7C, 7D and 7E are the top view, right side view, left side view, front view and rear view respectively of an exemplary inner cover of the skeleton frame according to the exemplary embodiment of the present invention. As illustrated in FIG. 6, skeleton frame 15 preferably has a generally overall rectangular shape with a low profile and comprises an inner cover 50 removably coupled to a strut 55 by at least one fastener 60 to form an interior chamber 65 to house the AMC, MicroTCA specific and optionally non-standard cards with one or more fasteners 106, such as, for instance, a screw (not illustrated) though, in other embodiments, the inner cover 50 and strut 55 can be secured by other appropriate securing methods. Inner cover 50 is generally rectangular sheet-like or plate-like structure with a top surface 70 and an opposing bottom surface 75 extending between a first pair of opposed substantially parallel edges 80, 85 and a second pair of opposed substantially parallel edges 90, 95 as best illustrated in FIGS. 6 and 7.

In some embodiments of the present invention, edges 80, 85 are substantially perpendicular to edges 90, 95. Extending outwardly from each edge 80, 85 and substantially perpendicular to the top surface 70 are one or more first tabs 100. Inner cover 50 includes a groove 105 where a portion of the surface 70 is bent away from the top surface 70 towards the bottom surface 75 to project from the bottom surface 75 in the form of a guide tab 110. Guide tab 110 extends substantially parallel and adjacent to edges 80, 85 and is coplanar with tabs 100 as may be seen in FIGS. 6 and 7. Guide tab 110 serves to guide and locate a filter assembly within the chassis 10 as will be explained. Inner cover 50 is provided with a first set of apertures 115 through which fasteners can be inserted. Each tab 100 also includes a structure defining at least one hole 120 for receiving a fastener. The hole 120 can be a through hole, a threaded hole, a blind hole or other construction to accommodate fasteners such as for instance, a screw, a nut and bolt, a rivet or other fasteners without falling outside the scope of the invention. To access the interior chamber 65, a central portion of the inner cover 50 is formed as an opening 125 defined by a rim 130 and having a first area extent 135.

In some embodiment of the present invention, structural features on inner cover 50, such as the size, number and location of first tabs 100, groove 105, guide tab 110, apertures 115, hole 120, opening 125 and rim 130 are symmetric about a plane perpendicular to the top surface 70 (and bottom surface 75) and parallel to edges 90, 95 and a plane perpendicular to the top surface 70 and parallel to edges 80, 85. Edge 80 (85) is provided with a plurality of attachment tabs 140 that include apertures 145. Attachment tabs 140 extend perpendicular to bottom surface and away from the top surface provides a point of attachment for locating and securing backplane 30 to chassis 10 as may be understood from the illustration of FIG. 4. Inner cover 50 can be made of any suitable material such as aluminum, steel, or other materials using a process such as metal forming, drawing or other suitable processes well known in the art. It is understood that the scope of the present invention is not limited by either the materials of construction or mode of fabrication of the constituent components of the chassis.

Strut 55 will be described with reference to FIGS. 3, 6 and 8. Strut 55 is a longitudinal member of length 155 (not illustrated) extending between a beam-front end 160 and beam-rear end 165. Strut 55 has a I-shaped cross-section 170 extending between a strut top surface 175 and an opposed strut bottom surface 180 of height 185 (not illustrated) to form a card guide assembly best depicted in the illustration of FIGS. 8B and 8D. I-shaped cross-section 170 has a width 189 (not illustrated) transverse to height 185. Width 189 has a left-side lateral surface 195 opposite a right-side lateral surface 200 best seen in the illustration of FIG. 8D. Lateral surfaces 190 and 195 are provided with first opposed longitudinal card-guides 205 and second opposed longitudinal card-guides 206, extending along the length 155, disposed at a first height 215 (not illustrated) and second height 220 (not illustrated) respectively from the bottom surface 180 such that card-guides 206 are proximate the strut top surface 175. Height 185 is determinative of the total height of the chassis 10 and a maximum height of AMC (or other module) 225 that may be accommodated within the chassis 10. Height 215 of opposed card guides 205 is selected to receive and guide the AMC having a height dimension that is less than or equal to the maximum height as defined by the specification of, for instance, the AdvancedMC.0, MicroTCA or other related standard. I-shaped cross-section 170 has a structure defining a plurality of cross-section apertures 230 for placing the lateral surfaces 190 and 195 in fluid communication with each other. Top and bottom surfaces 175 and 180 are provided with attachment-apertures 235 sized and located to allow strut 55 to be mated to inner cover 50 using a fastener or other suitable fastening method to form the skeleton frame 15 as will be described in the following sections.

Referring again to FIG. 3 there is shown a partial assembly of the skeleton frame 15 according to one embodiment of the present invention. Bottom surfaces 180 of a plurality of struts 55 are fastened to the bottom surface 75 of a first inner cover 50 so that the length 155 of struts 55 is disposed parallel to the edges 90, 95 of the inner cover 50. Struts 55 are disposed spaced apart to define card slot 250 between adjacent struts 55 to accommodate AMC (or other module) 225. Bottom surface 75 of a second inner cover 50 is fastened to the top surface 175 of struts 55 so that corresponding first tabs 100 of the first and second inner covers 50 are adjacent to each other with corresponding holes 120 on respective first tabs 100 in substantial alignment for accepting fasteners therethrough to releasably mate the first and second inner covers 50 to form the skeletal frame 15 as depicted, for example, in the illustration of FIG. 3.

As will be appreciated, the terms "top," "bottom," "side," and "rear", "right side", "left side", "exterior" and "interior" are exemplary only and are not intended to limit the orientation of the enclosure housing or the electronic control enclosure unless specifically referenced in a context which so indicates.

As illustrated in FIGS. 4 and 10, in one embodiment the chassis 10 includes a generally C-shaped cover 20 having a generally rectangular sheet-like or plate-like structure with a cover-top surface 270 and an opposing cover-bottom surface 275 extending between a first pair of opposed substantially parallel edges 280, 285 and a second pair of opposed substantially parallel edges 290, 295. Projecting downwardly from edges 290 and 295 are side walls 300 and 305 respectively. Each side wall 300, 305 has disposed on it a plurality of perforations 310 sized and shaped to allow air flow therethrough. Cover 20 is provided with a plurality of cover-apertures 315 through which fasteners can be inserted. To facilitate access to the interior chamber 65, a central portion of the cover 20 is formed as a cover opening 325 defined by a cover rim 330 and having a second area extent 335 (not illustrated).

Cover opening 325 has a shape that is substantially identical to the shape of opening 125 on inner cover 50 but the area 335 is proportionally larger than area 235. Cover 20, including the structural features associated with cover 20, is symmetric about a plane perpendicular to the cover-top surface 270 and parallel to edges 280, 285 as well as about a plane perpendicular to the cover-top surface 270 and parallel to edges 290, 295.

In one embodiment of the present invention, cover 20 is placed over inner cover 50 of the skeleton frame 15 with edges 280, 285, 290 and 295 of cover 20 being in substantial parallel alignment with edges 80, 85, 90 and 95 of inner cover 50. Cover 20 is shaped and dimensioned such that cover-bottom surface 27 substantially conforms to a portion of the inner cover 50 such that at least one cover-aperture 315 is in substantial alignment with hole 120 on tab 100 so that a fastener can be inserted through each corresponding cover aperture 315 and hole 120 to releaseably fasten cover 20 to inner cover 50 of skeleton frame 15 as best illustrated in FIG. 5. In this configuration, cover opening 325 is concentrically located with opening 125 with cover rim 330 disposed around and outward of rim 130 so as to form a ledge 345 extending between the two rims. Access panel 350, depicted in FIG. 4, is a flat sheet-like structure with a peripheral edge 360 that is shaped and dimensioned to substantially conform to the rim 330. In one embodiment, access panel 350 may be supported on the ledge 345 extending between the cover-rim 330 and rim 130 on inner cover 50 so that peripheral edge 360 is located adjacent to cover rim 330 and the cover opening 325 is substantially covered. Access panel 350 is removably fastened to the inner cover 50 using fasteners inserted through access panel apertures 365 on access panel 350 that align with suitably disposed apertures 115 on inner cover 50 when access panel 350 is located on ledge 345. In this configuration, access panel 350 encloses interior chamber 65 housing AMC and other modules according to the present invention. Upon removal of access panel 350, access is obtained to the electrical components inside the interior chamber 65 for testing and probing the components on an AMC or other modules housed within the interior chamber 65 but without interrupting the operation of the other modules.

Figure 23:
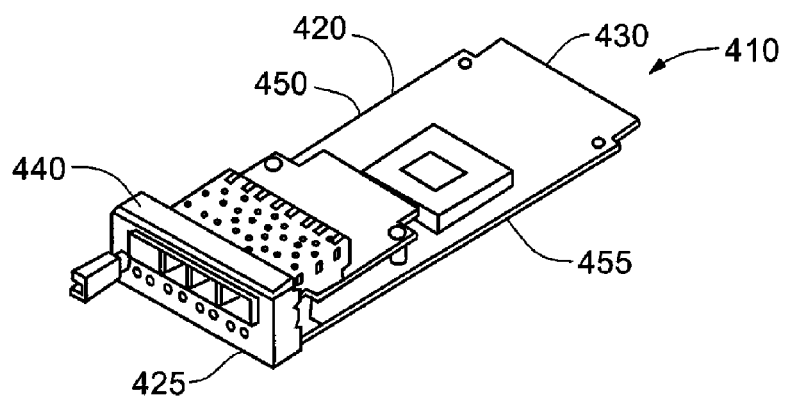
FIG. 23 illustrates an AMC module

As depicted in FIGS. 1, 2, 3 and 5, skeleton frame 15, including the inner covers 50 and struts 55, the covers 20, and backplane 30 define an enclosure with card slots 400 suitable for receiving AMC cards and other modules 410 exemplified in FIG. 23. A typical AMC module 410 comprises a printed circuit board 420 with a front end 425 and a rear end 430. Rear end 430 has a structure suitable for mating with an AMC connector 32 on backplane 30 attached to inner cover on edge 85 as seen in FIG. 4 for instance. Front end 425 of AMC module 410 includes a face plate 440 of a standard specified height such as for example, half-height, full-height. AMC module 410 includes side parallel edges 450, 455. In operation, AMC card 410 is inserted into a card slot 400 so that edges 450 and 455 are received within card guide slots 205 (206) and progressively inserted along length 155 of chassis 10 until the rear end 430 is physically mated with AMC connector 32.

FIGS. 2-4 depict a plurality of AMC (and optionally non-AMC modules) in a fully inserted position within chassis 10. Strut 55 includes a electro static discharge (ESD) clip 475 that wipes the edge 450 (455) of AMC card 410 as it is progressively slid into card guide slot 205(206) as seen in FIGS. 8 and 9. ESD clip provides a path to chassis ground to discharge and prevent buildup of electro static discharge. A faceplate 25 illustrated in FIG. 11 is mounted in the opening of skeleton frame 15 defined between edges 80 of inner cover 50. Faceplate 25 has top 26, bottom 27 and side walls 28 that provide a seal between the chassis 10 and the faceplate 440 of AMC card 410. To shield the components that are housed in the interior chamber 65 from electrical-magnetic interference, an ESD backer plate 29 illustrated in FIG. 12 may be attached to the inner surfaces of the top 26, bottom 27, side 28, walls of faceplate 25. Additionally, a gasket coated with an EMI shielding material can be attached to each surface of the ESD backer plate. FIGS. 6 and 13 illustrate a back-cover 515 that encloses the region of the chassis 10 where the backplane is attached to the chassis. Back-cover 515 includes coverlets 520 and 525 that may be removed when interconnects (not illustrated) have to extend outside the enclosure formed by the chassis 10.

In addition to housing the AMC module 410, the chassis 10 of one embodiment of the present invention provides dual bays for cooling units 600 best illustrated with reference to FIG. 3. In one exemplary embodiment, the cooling unit comprises a pair of identical fan modules 610. Each fan module is a longitudinal chamber housing at least one fan 620. One of the fans is located in a bay proximate edge 90 and serves to aspirate air into the interior chamber 65 and force it along a path substantially parallel to edges 80 (85) towards the other fan 620 which sucks the air and blows it out of the interior chamber 65. A filter 630 is interposed between the fan proximate edge 90 (alternatively "inlet side"). Filter 630 is guided and located within the interior chamber 65 by guide tabs 110 illustrated in FIG. 3. The use of features such as tab 100 on the inner cover 50 and cross-section apertures 230 on struts 55, the chassis of the present invention presents a relatively unobstructed flow path for air along the direction of flow i.e. parallel to the edges 80, 85.

Figure 14:
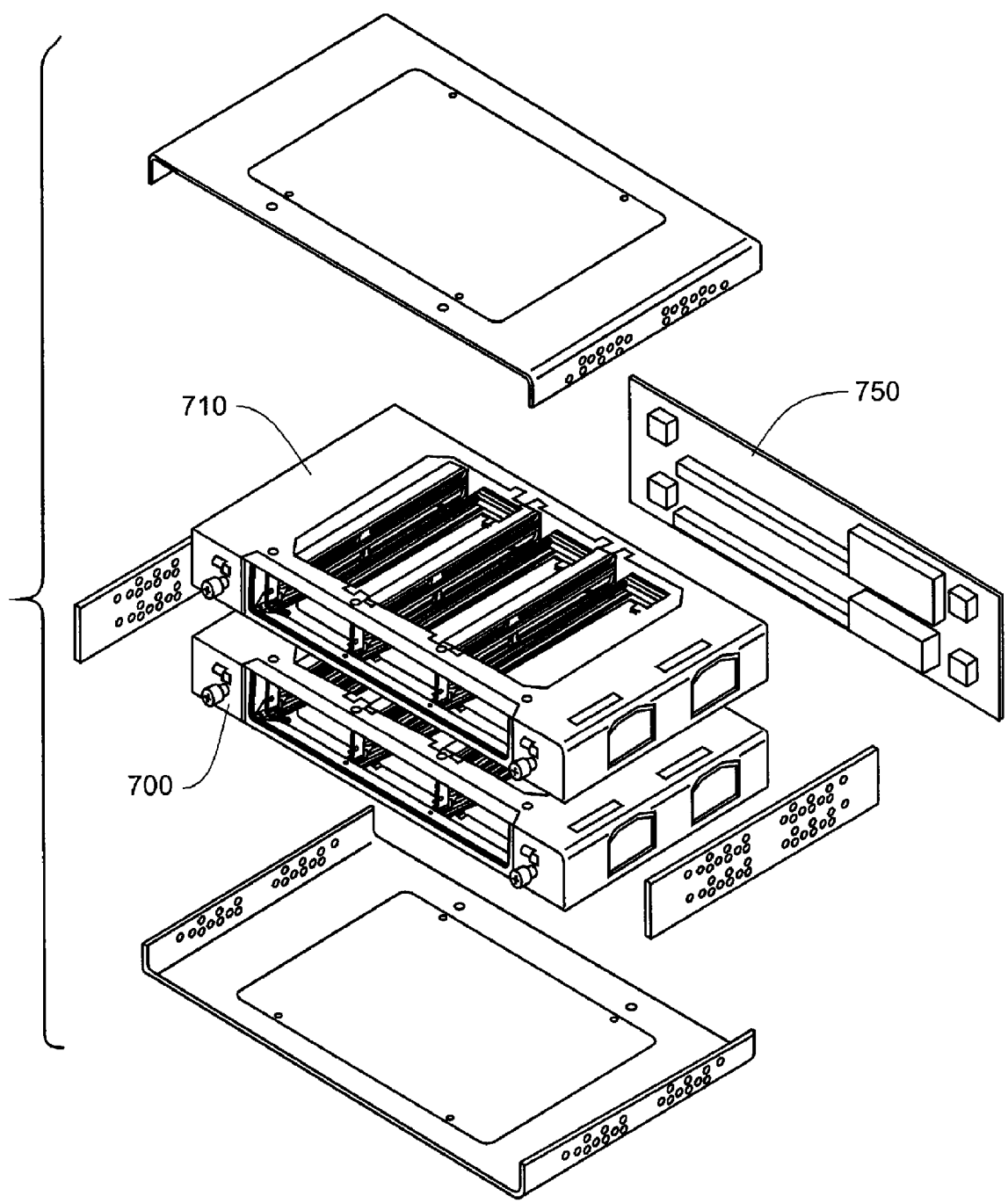
FIG. 14 is an exploded isometric view of a stacked modular unit according to an exemplary embodiment of the present invention
Figure 24:
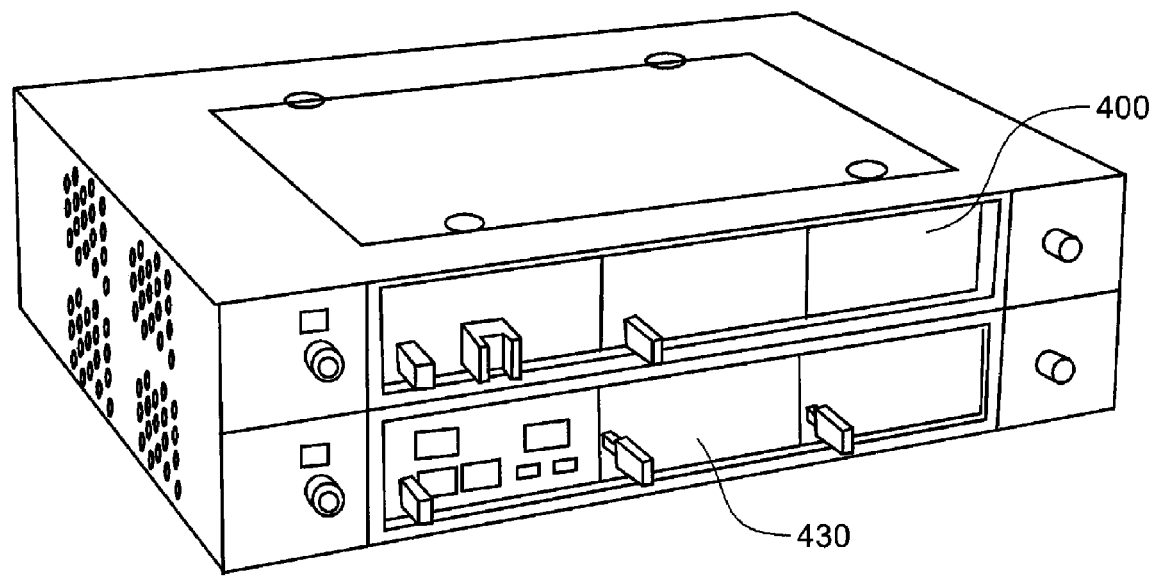
FIG. 24 illustrates an exemplary 2 U modular unit according to an embodiment of the present invention.

As shown in FIGS. 14 and 24, in some embodiment all of the modules received within card slots 400 are interchangeable. In particular, chassis unit 10 can be considered a base unit or unit chassis. A plurality of unit chasses may be stacked vertically, as shown in FIG. 24 for instance, to obtain a scaled, composite unit which is capable of housing diverse AMC and other modules to deliver enhanced capacity and functionality as will be described next.

Referring now to FIGS. 14 thru 18, FIG. 14 depicts an exploded view of a stacked configuration comprising a first unit chassis 700 and a second unit chassis 710 each of height 1 U stacked vertically to obtain a composite unit of height 2 U illustrated in FIG. 24. In one embodiment, the electromechanical assembly 30 comprising the backplane 30 of each individual unit chassis 700 (710) is replaced by a second backplane 715 that is 2 U tall and is equipped with the connectors, fabric interconnects and other features needed to provide backplane functionality to each of the first and second unit chasses 700 (710).

Figure 15A:
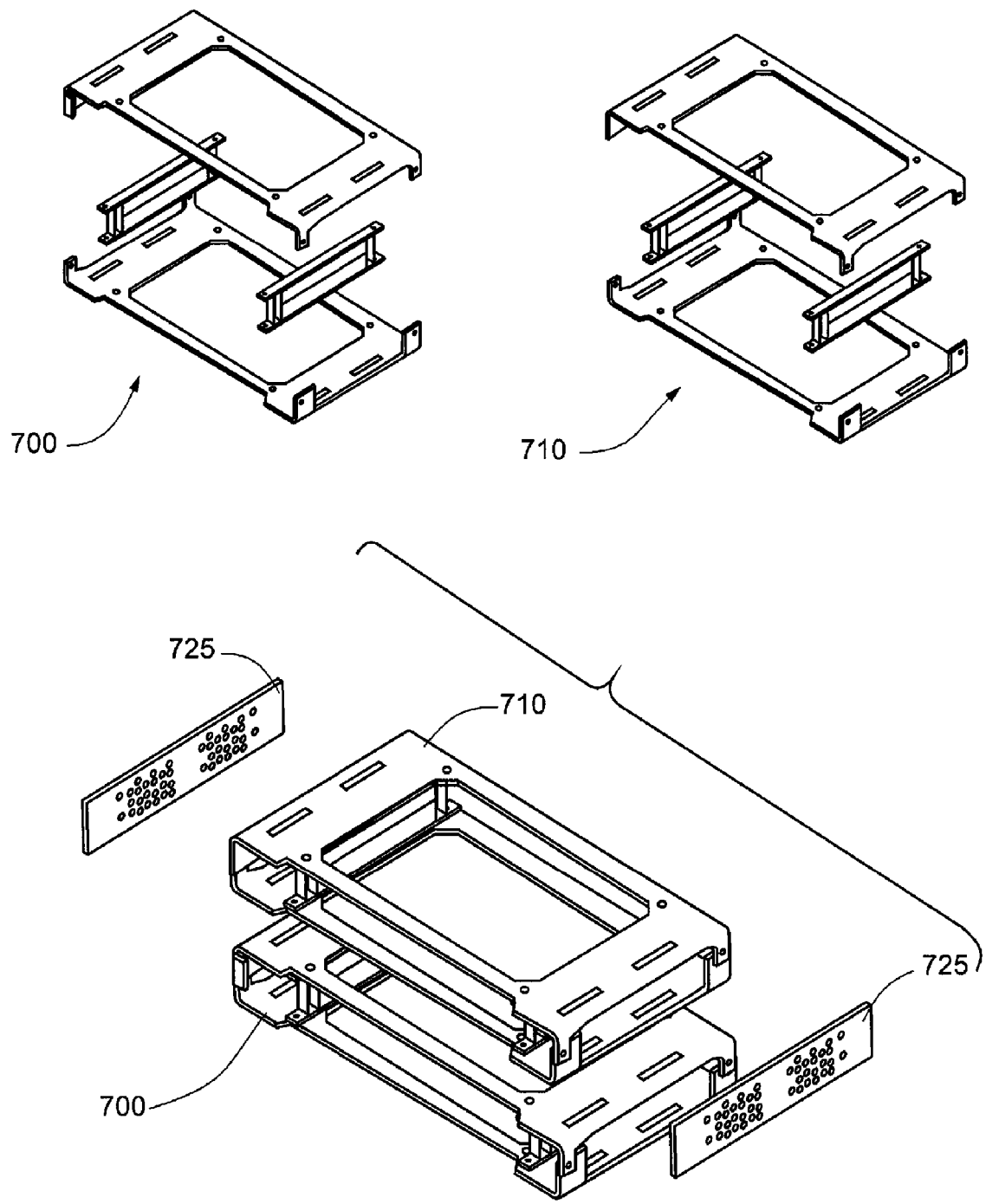
Figure 15C:
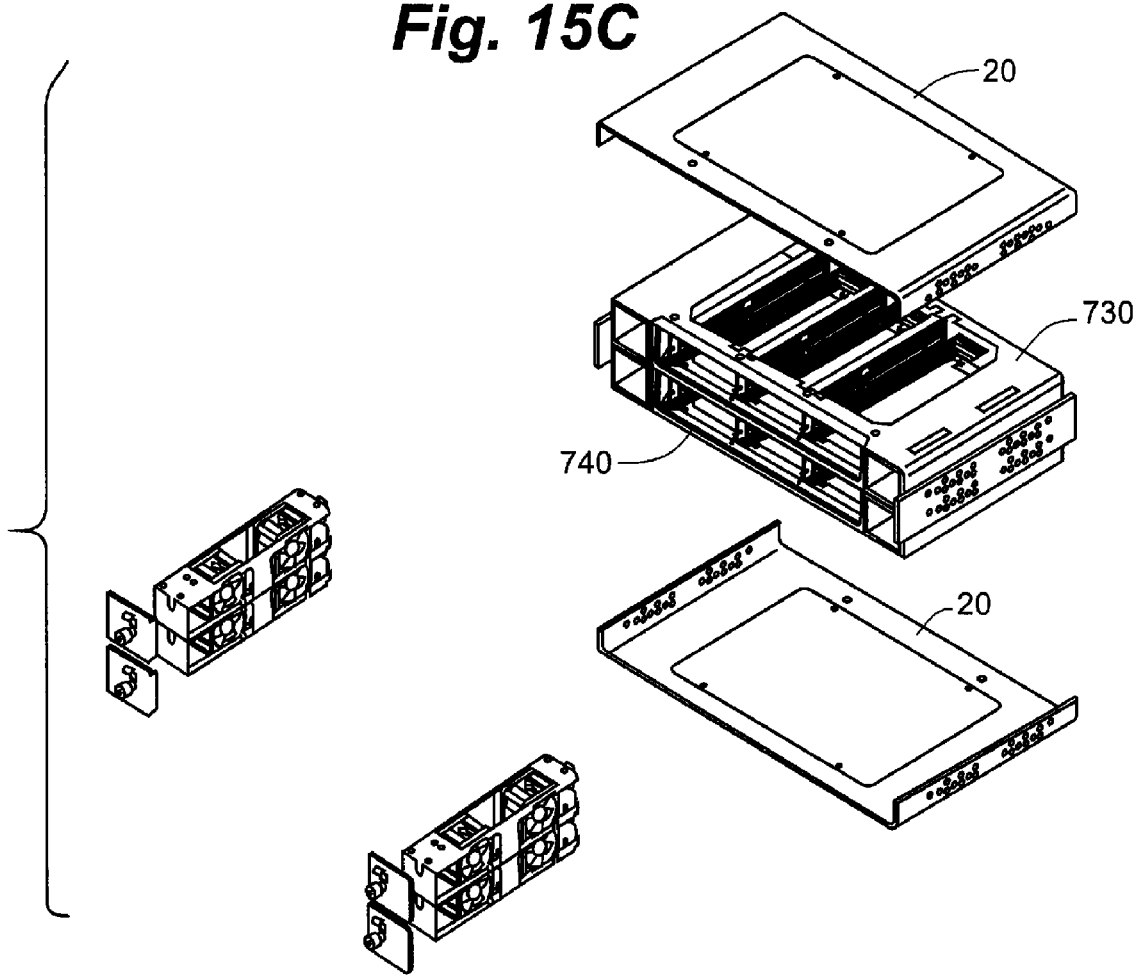
Figure 15D:
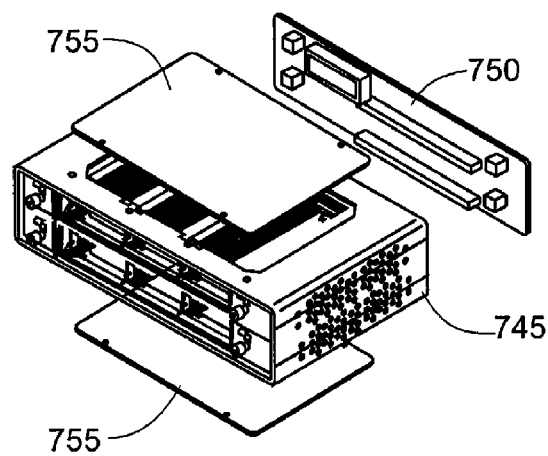

A method to assemble the stacked modular chasses of the present invention will now be described with reference to FIGS. 15A thru 15D. As shown in FIG. 5A, step 1 comprises assembling first and second unit chassis 700 and 710 respectively as disclosed in the preceding sections of this disclosure. It is understood that the first step is to assemble the skeleton frames 15 of each of the unit chasses 700 and 710. If the chasses 700 and 710 already exist, one of the covers 20 of each chassis 700 and 710 is removed and the chasses stacked vertically such that the inner cover 50 of first chassis 700 and second chassis 710 are directly in physical contact as shown in FIGS. 15A and 15B. An expander plate 725 may be used to fasten each of the chassis 700 and 710 to each other as shown in FIG. 15B. Covers 20 are positioned and fastened to a top side 730 of unit chassis 710 and bottom side 740 of chassis 700 to form a partial composite structure 745 as shown in FIG. 15D. A backplane 750 of height 2 U is attached to a rear end of the partial composite structure 745. Access panels 755 may be attached to covers 20 fastened to the top side 730 and bottom side 740 to complete the assembly.

Figure 16:
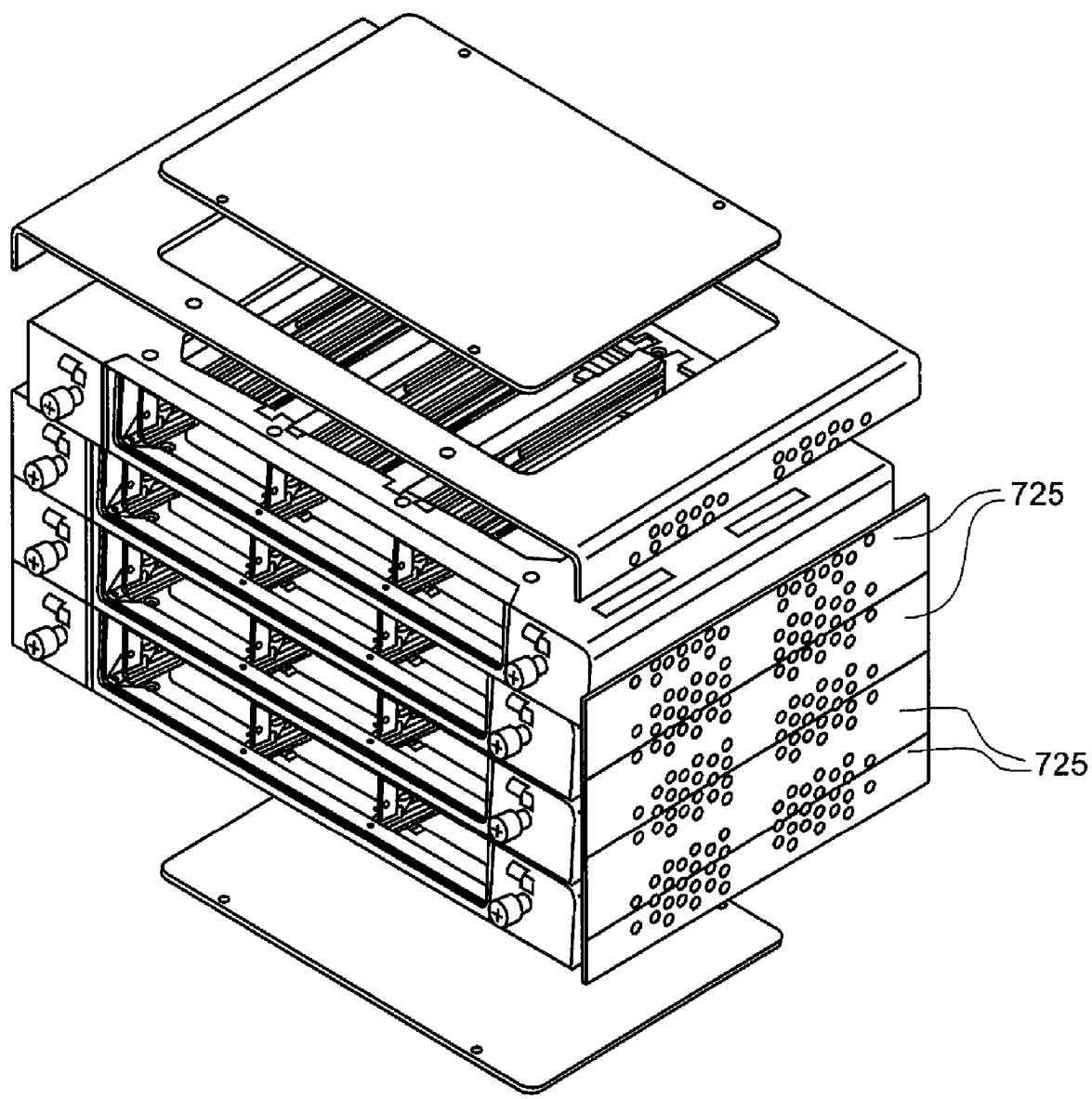
FIG. 16 is an exemplary stacked modular unit that is 4 U tall.

Referring now to FIG. 16, there is shown a staked module that is 4 U in height. The 4 U module is constructed in the manner described in the immediately preceding section but instead of stacking two chasses, four unit chassis are stacked vertically and three expander plates 725 are used to attach the chasses to each other instead of a single expander plate 725. In an alternate embodiment, the expander plate is of a size that accommodates a stack that is more than 2 U tall. Recognizing that there may be an unutilized slot in the stack and to prevent air-flow from being diverted out of the interior enclosure 65 of the staked module, a dummy AMC card with a faceplate and AMC form factor but with no functionality is utilized to seal the slot and prevent air leaks.

In another embodiment, the present invention contemplates a AMC card form factor with a faceplate and a mechanical structure to obstruct the flow and divert it off the designed-for path. In this manner, the multiple fan modules of the stacked modular structure and the relatively unobstructed construction of each unit chassis may be advantageously utilized to tailor the air flow through the interior enclosure 65 of the stacked modules.

Figure 18:
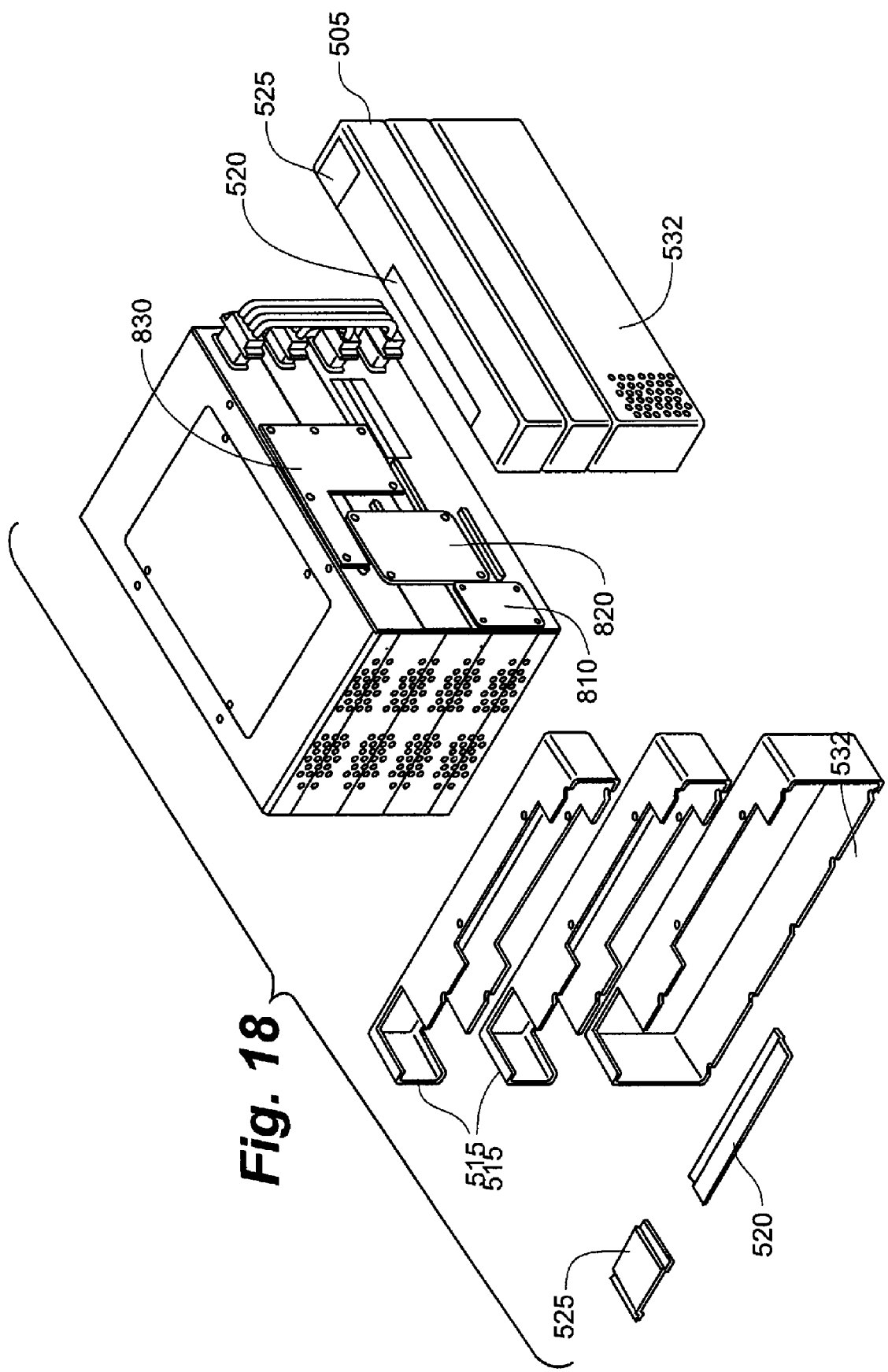
Figure 19:
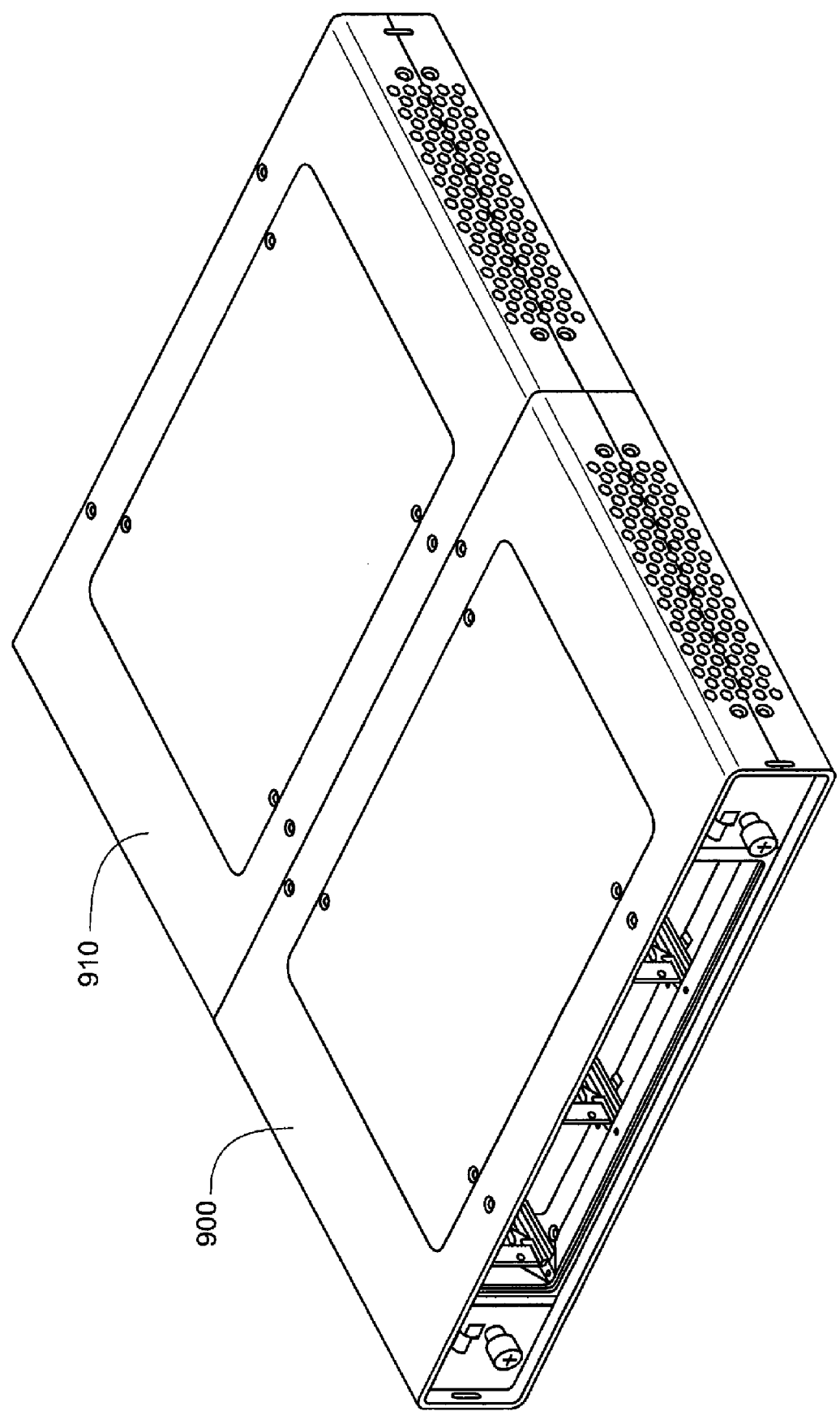

FIGS. 17 and 18 depict another feature of the present invention wherein a special unit is a base unit 800. To facilitate communication between remote modules over their respective backplanes or to facilitate inter-backplane signal transfer, interconnect panels 800, 820 or 830 are used. In one embodiment, the interconnect panel is a passive interconnect in that the signals are transferred over traces that interconnect two points on different backplanes. In a second embodiment, the interconnect panel is an active interconnect in that the interconnect panel includes circuitry to recondition a signal in transit between two points on separate backplanes. The reconditioning can utilize signal equalization and pre-emphasis well known in the art to recondition a degraded signal. FIG. 18 depicts three interconnect panels 810, 820 and 830 extending and communicatively coupling points on backplanes of the second module, the third module and the fourth module in the stack to a point on the backplane of the first module. Back-cover 515 of height 1 U is combined with a back-cover 532 of height 2 U to form a back-cover of height 4 U. Removable panels 520 and 525 are absent in the interfaces between the back-covers 515 and 532 to allow the interconnect panels 810, 820 and 830 to extend vertically between backplanes.

Referring now to FIGS. 19 through 22, there is illustrated another feature of the present invention wherein a pair of unit chassis 900 and 910 are physically and communicatively coupled via a mid-plane 920. As shown in FIG. 20, unit chassis 900 is configured to house AMC cards and is equipped with a backplane 30 as described in the foregoing sections. Unit chassis 910 is configured as a rear transition module (RTM) equipped to receive a rear transition board 925 that may be a proprietary board such as for example, a single board computer (SBC). Interconnect backplane 920 interconnects the rear transition board 925 to the AMC modules in unit chassis 900 via the backplane 30. Rear transition board 925 is provided with probe points and test points that may be accessed through access panel 945 without interrupting the operation of the AMC modules or the rear transition board 925. AMC modules may request and obtain resources provided on the rear transition board 925. In another embodiment, the rear transition board 925 requests resources such as storage units, made available through the AMC modules housed in unit chassis 900.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A chassis for providing electrical, mechanical and environmental housing for Telecom Computing Architecture (TCA) compliant modules, the chassis comprising:
   a first unit chassis compliant with a TCA standard and having a first form factor that defines a front side and a back side of the first unit chassis and adapted to house a plurality of TCA compliant modules, including at least one module that provides power and control to at least the plurality of modules housed in the first unit chassis;
   a second unit chassis compliant with the TCA standard and the first form factor that defines a front side and a back side of the second unit chassis and adapted to house a plurality of TCA compliant modules, including a rear transition module;
   a transition board that operably couples to the rear transition module, the transition board including a single board computer; and
   a shared backplane that operably couples the back side of the first unit chassis with the transition board at the back side of the second unit chassis, the shared backplane including printed circuitry operable to provide data communications between the plurality of modules housed within the first unit chassis and at least one module housed within the second unit chassis.

2. The chassis of claim 1 wherein the shared backplane is arranged as a mid-plane and the first unit chassis and the second unit chassis are configured in a back-to-back arrangement with the mid-plane interposed between the back side of the first unit chassis and the back side of the second unit chassis.

3. The chassis of claim 1 wherein the first unit chassis and the second unit chassis are configured in a stacked arrangement with a bottom cover of the first unit chassis and a top cover of the second unit chassis defining an outer boundary of the chassis without any corresponding cover for a top of the first unit chassis and a bottom of the second unit chassis.

4. The chassis of claim 1 wherein the first unit chassis and the second unit chassis are configured in a stacked arrangement with a single MCH housed in the first unit chassis that provides the IPMI management, networking, and clock infrastructure to all of the unit chasses in the stacked arrangement.

5. The chassis of claim 1 wherein each of the plurality of modules in each unit chassis is hot swappable without disruption of operation of other modules in other unit chasses.

6. The chassis of claim 1 wherein each of the plurality of modules is compliant with MicroTCA standards.

7. The chassis of claim 1 wherein the first unit chassis and the second unit chassis are configured in a stacked arrangement and wherein the shared backplane is comprised of at least one modular backplane extender having connectors disposed along at least one edge that are adapted to connect to at least one other backplane component to form a generally planar arrangement of the shared backplane.

8. The chassis of claim 7 wherein at least one of the modular backplane extender and the backplane component include active circuitry to condition at least a portion of the signals communicated therebetween via the connectors disposed along at least one edge.

9. The chassis of claim 1, further comprising:
   a cover structure disposed on at least one of a top side or bottom side of the unit chassis that forms a portion of an enclosure defined by the unit chassis, the cover including at least one removable access panel that provides access to the enclosure and to the plurality of modules while maintaining structural integrity of the unit chassis.

10. The chassis of claim 9 wherein the access panel is adapted to cover an area that less than a surface area of one of the top side or bottom side of the unit chassis and be removed from the unit chassis such that a skeletal framework of the unit chassis is unaffected by removal of the access panel.

11. The chassis of claim 10 wherein the access panel comprise a pair of panels, each adapted to cover one of a corresponding top side and bottom side of the unit chassis to permit access to the enclosure from more than a single direction.

12. The chassis of claim 10 wherein the access panel is positioned generally flush with a corresponding cover structure and is at least partially supported by a recessed lip defined within the cover structure and corresponding to at least a portion of the area that is less than the surface area of one of the top side or bottom side of the corresponding cover structure.

13. A chassis for providing electrical, mechanical and environmental housing for Telecom Computing Architecture (TCA) compliant modules, the chassis comprising:
   a unit chassis having a first form factor compliant with a TCA standard and adapted to house a first number of electronic modules in a corresponding slots in a first configuration compliant with the TCA standard, and adapted to house a second number of electronic modules in corresponding slots in a second configuration, the second configuration being compliant with the TCA standard and different than the first configuration, the unit chassis, including a frame structure and a plurality of struts, having an I-shaped cross-section, cooperating with the frame structure to accommodate the electronic modules, the struts adapted to be selectively positioned in a first position in the frame structure to create the first configuration and in a second position in the frame structure to create the second configuration, and being adjustably reconfigurable between the first and second configurations without a change in outer dimensions of the first form factor;
   wherein the struts include at least two pair of card guide assemblies located at different heights on each of two opposite lateral surfaces formed by the I-shaped cross-section of each strut; and
   wherein the struts are further adapted to contain apertures located between the card guide assemblies sized to allow an air flow through the struts.

14. The chassis of claim 13 wherein the TCA standard is a MicroTCA standard, the electronic modules are AMC cards and the first position supporting a single wide AMC card and the second position supporting a double wide AMC card.

15. A chassis for providing electrical, mechanical and environmental housing for Micro Telecom Computing Architecture (MicroTCA) compliant modules in a Pico-shelf compliant configuration, the chassis comprising:

- a first unit chassis compliant with a MicroTCA standard and having a first form factor that defines a front side and a back side of the first unit chassis in compliance with a Pico-shelf standard of the MicroTCA standard and a cover positioned on one of a top side or a bottom side of the chassis, the first unit chassis including a frame structure and a plurality of struts cooperating with the frame structure to accommodate a plurality of MicroTCA compliant modules, including at least one module that provides power and control to at least the plurality of modules housed in the first unit chassis;
- a second unit chassis compliant with the MicroTCA standard and having the first form factor that defines a front side and a back side of the second unit chassis in compliance with the Pico-shelf standard of the MicroTCA standard and a cover positioned on the other of the top side or the bottom side of the chassis from the cover of the first unit chassis, the second unit chassis including a frame structure and a plurality of struts cooperating with the frame structure to accommodate a plurality of MicroTCA compliant modules;
- at least one third unit chassis compliant with the MicroTCA standard and having the first form factor that defines a front side and a back side of each third unit chassis in compliance with the Pico-shelf standard of the MicroTCA standard, the third unit chassis including a frame structure and a plurality of I-shaped struts cooperating with the frame structure to accommodate a plurality of MicroTCA compliant modules, wherein all of the third unit chassis are positioned vertically between the first unit chassis and the second unit chassis in a stacked configuration; and
- a shared backplane that operably couples the back sides of the first unit the second unit chassis and the at least one third unit chassis in the stacked configuration, the shared backplane including printed circuitry operable to provide data communications between the plurality of modules housed within the first unit chassis and at least one module housed within the second unit chassis and at least one module housed within the at least one third unit chassis;
- wherein the I-shaped struts include at least two pair of card guide assemblies located at different heights on each of two opposite lateral surfaces formed by the I-shape of each strut; and
- wherein the I-shaped struts are further adapted to contain apertures located between the card guide assemblies sized to allow an air flow through the struts.

16. The chassis of claim 15 wherein the shared backplane is a single, planar power management and distribution printed circuit board (PCB).

17. The chassis of claim 15 wherein the shared backplane provides an integrated power and signal management system spanning the unit chasses in the stacked configuration from the at least one module that provides power and control in the first unit chassis.

18. The chassis of claim 13 further comprising:
- a filler module adapted to be inserted into an unoccupied slot in the first unit chassis, the filler module including means for redirecting the cooling air flow from the first unit chassis to the second unit chassis.

19. The chassis of claim 13, further comprising:
- at least two fan modules insertably housed in the unit chassis from the front side that each provide a cooling air flow to at least the plurality of modules housed in the first unit chassis,
- a first of the fan modules directing air flow from the front side to the back side and a second the fan modules directing air flow from the back side to the front side.

* * * * *